(12) United States Patent
Zhang et al.

(10) Patent No.: US 12,398,738 B2
(45) Date of Patent: Aug. 26, 2025

(54) INTEGRATED ASSEMBLY OF AN ELECTRIC MOTOR, HYDRAULIC PUMP, AND ELECTRONIC DRIVE DEVICE AND ASSOCIATED COOLING CONFIGURATION

(71) Applicant: Parker-Hannifin Corporation, Cleveland, OH (US)

(72) Inventors: Hao Zhang, Twinsburg, OH (US); Satish Kumar Raju Kalidindi, Mayfield Heights, OH (US); Nithin Gangadharan, Twinsburg, OH (US); Brandon Wegmann, Indian Trail, NC (US); Steven R. Huard, New Ulm, MN (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 18/699,380

(22) PCT Filed: Jul. 21, 2022

(86) PCT No.: PCT/US2022/037849
§ 371 (c)(1),
(2) Date: Apr. 8, 2024

(87) PCT Pub. No.: WO2023/132864
PCT Pub. Date: Jul. 13, 2023

(65) Prior Publication Data
US 2024/0410402 A1 Dec. 12, 2024

Related U.S. Application Data

(60) Provisional application No. 63/297,839, filed on Jan. 10, 2022.

(51) Int. Cl.
*F15B 15/20* (2006.01)
*F15B 13/04* (2006.01)
*H02K 9/19* (2006.01)
*H05K 7/20* (2006.01)

(52) U.S. Cl.
CPC ......... *F15B 15/20* (2013.01); *F15B 13/0401* (2013.01); *H02K 9/19* (2013.01); *H05K 7/20927* (2013.01)

(58) Field of Classification Search
CPC ..... H02K 5/20; F04C 29/047; F04C 15/0096; F15B 15/20
See application file for complete search history.

(56) References Cited

U.S. PATENT DOCUMENTS 6,201,365 B1 * 3/2001 Hara .................... B60L 1/02
                                                                903/952
8,169,110 B2    5/2012 Swales et al.
(Continued)

FOREIGN PATENT DOCUMENTS

CN    107 044 416 A    8/2017
JP    2009-71975 A     4/2009
(Continued)

OTHER PUBLICATIONS

International Search Report and Written Opinion prepared by European Patent Office in application No. PCT/US2022/037849 dated Oct. 27, 2022.
(Continued)

*Primary Examiner* — Abiy Teka
(74) *Attorney, Agent, or Firm* — McDonnell Boehnen Hulbert & Berghoff LLP

(57) ABSTRACT

An example assembly includes: a main housing (108) having an internal chamber (110) therein; an electric motor (102) disposed in the internal chamber of the main housing and comprising a motor rotor (114); a cooling inner ring (700) disposed in the internal chamber of the main housing about the electric motor, wherein the cooling inner ring comprises one or more motor cooling fluid channels configured to receive cooling fluid from an external source of cooling fluid and allow cooling fluid to flow about the
(Continued)

electric motor to cool the electric motor; a hydraulic pump (104) positioned in the main housing, at least partially within the motor rotor of the electric motor; and an enclosure (173) coupled to the main housing and comprising (i) an inverter board (202) disposed therein, and (ii) one or more inverter cooling fluid channels configured to allow cooling fluid from the external source to cool the inverter board.

20 Claims, 12 Drawing Sheets

(56) References Cited

U.S. PATENT DOCUMENTS

| | | | |
|---|---|---|---|
| 2017/0343098 A1* | 11/2017 | Rosinski | F04C 15/0096 |
| 2021/0309099 A1* | 10/2021 | Long | B60K 1/00 |

FOREIGN PATENT DOCUMENTS

| | | |
|---|---|---|
| JP | 2013-172564 A | 9/2013 |
| JP | 2017-127183 A | 7/2017 |
| KR | 2011 0072323 A | 6/2011 |
| WO | 2015/087743 A1 | 6/2015 |
| WO | 2016/185575 A1 | 11/2016 |
| WO | 2017/038334 A1 | 3/2017 |

OTHER PUBLICATIONS

Notification of Reasons for Rejection issued by the Japanese Patent Office in application No. 2024-541727 mailed Apr. 10, 2025, English translation included.

\* cited by examiner

INTEGRATED ASSEMBLY OF AN ELECTRIC MOTOR, HYDRAULIC PUMP, AND ELECTRONIC DRIVE DEVICE AND ASSOCIATED COOLING CONFIGURATION

CROSS-REFERENCE TO RELATED APPLICATION

This application is a U.S. National Phase Application pursuant to 35 U.S.C § 371 of International Application No. PCT/US2022/037849 filed on Jul. 21, 2022, which claims priority to U.S. Provisional Application No. 63/297,839, filed Jan. 10, 2022, the entire contents of all of which are herein incorporated by reference.

BACKGROUND

An electric motor can be used to drive a hydraulic pump. For example, an output shaft coupled to a rotor of the electric motor can be coupled to a shaft of the hydraulic pump, such that rotation of the rotor can cause a rotating group of the hydraulic pump to rotate and provide fluid flow.

An electronic drive device including an inverter and motor controller is typically separate from the motor and is connected to wire windings of a stator of the electric motor via cables. It may be desirable to have an assembly that integrates the hydraulic pump and the electronic drive device with the electric motor. This way, mechanical components, such as shafts, bearing, etc., can be shared between hydraulic pump and the motor. It may also be desirable to properly support components of the electric motor and the hydraulic pump and maintain them lubricated to elongate the life of the assembly.

Typically, a hydraulic system may have a system controller that controls the actuator in addition to the controller of the electric motor and hydraulic pump. Thus, multiple controllers may be in communication with each other with cables and signals connecting them. It may thus be desirable to configure the electronic drive device of the assembly to receive actuator sensor information associated with an actuator driven by the hydraulic pump, and the electronic drive device can then control the electric motor and hydraulic pump to achieve commanded motion of the actuator. This way, the system controller can be integrated with the electric motor controller into a single controller and avoid having cables, buses, or signals between separate controllers.

During operation, heat is generated and may cause damage to components of the assembly. It may be desirable to cool components of the electric motor. It may further be desirable to cool the electronic drive device (e.g., the inverter) as it may generate a large amount of heat during operation.

It is with respect to these and other considerations that the disclosure made herein is presented.

SUMMARY

The present disclosure describes implementations that relate to systems an integrated assembly of an electric motor, hydraulic pump, and electronic drive device and associated cooling configuration.

In a first example implementation, the present disclosure describes an assembly comprising: a main housing having an internal chamber therein: an electric motor disposed in the internal chamber of the main housing and comprising a motor rotor: a cooling inner ring disposed in the internal chamber of the main housing about the electric motor, wherein the cooling inner ring comprises one or more motor cooling fluid channels configured to receive cooling fluid from an external source of cooling fluid and allow cooling fluid to flow about the electric motor to cool the electric motor; a hydraulic pump positioned in the main housing, at least partially within the motor rotor of the electric motor; and an enclosure coupled to the main housing and comprising (i) an inverter board disposed therein, and (ii) one or more inverter cooling fluid channels configured to allow cooling fluid from the external source to cool the inverter board.

In a second example implementation, the present disclosure describes a hydraulic system comprising: an actuator having a first chamber and a second chamber; and a valve assembly configured to control fluid flow to and from the first chamber and the second chamber of the actuator; and the assembly of the first example implementation.

The foregoing summary is illustrative only and is not intended to be in any way limiting. In addition to the illustrative aspects, implementations, and features described above, further aspects, implementations, and features will become apparent by reference to the figures and the following detailed description.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying Figures.

DETAILED DESCRIPTION

The present disclosure relates to integrating or embedding a hydraulic pump and an electronic drive device (e.g., including a motor controller and an inverter) with an electric motor to have an assembly providing a compact configuration that reduces cost by sharing components, saves space, and enhances reliability. The assembly also includes a cooling configuration where an external source provides cooling fluid to cool the electronic drive device and the electric motor.

The rotor of the electric motor is properly supported at two points, on its exterior surface and interior surface, to provide enhanced support while allowing components of the hydraulic pump to be disposed, at least partially, within the rotor. The drive shaft of the hydraulic pump is drivingly connected to the rotor of the electric motor via a spline connection, and the spline connection is maintained lubricated and sealed to enhance life and performance of the assembly.

Figure 1:
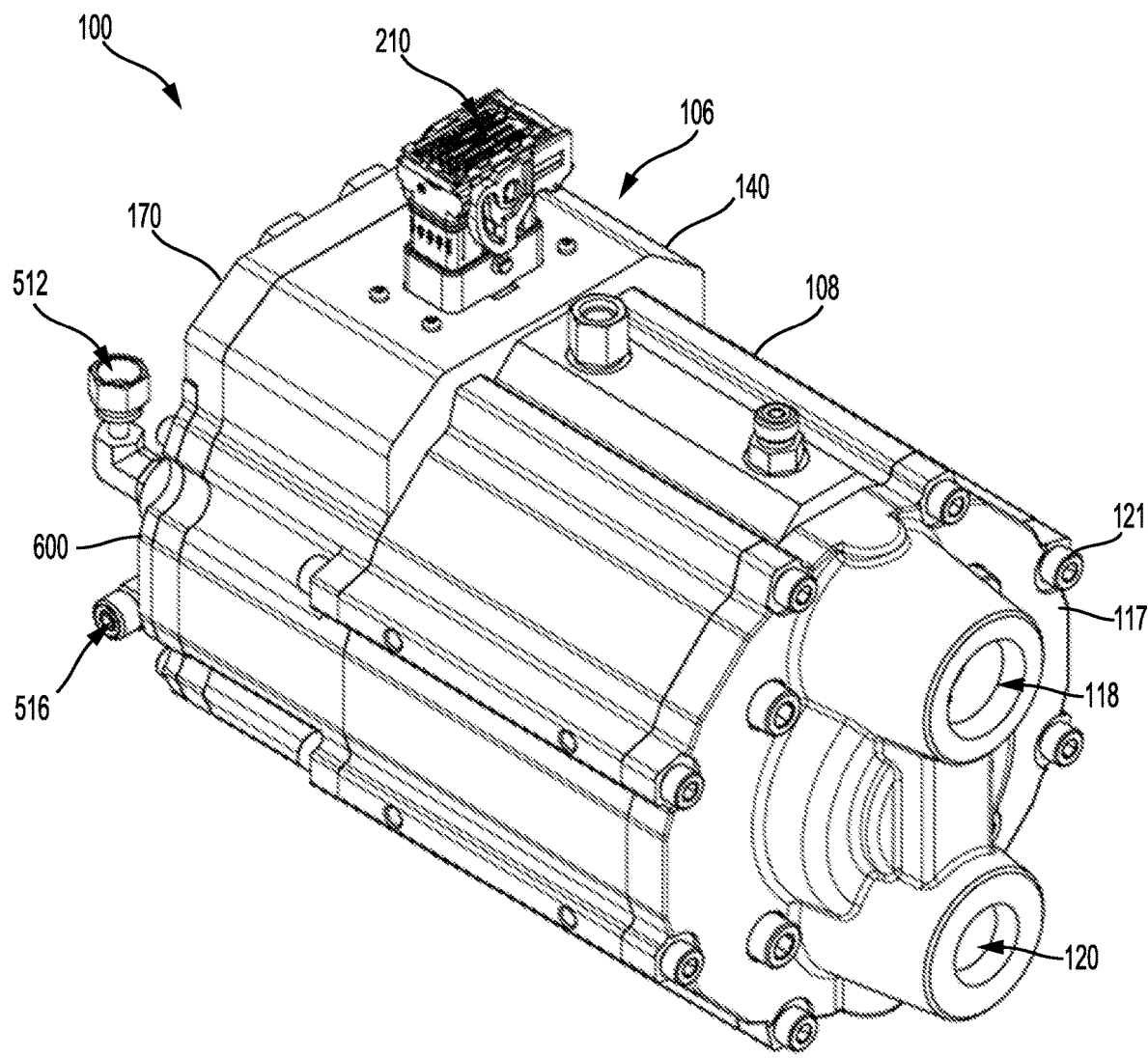
FIG. 1 illustrates a perspective view of an assembly, in accordance with an example implementation.
Figure 2:
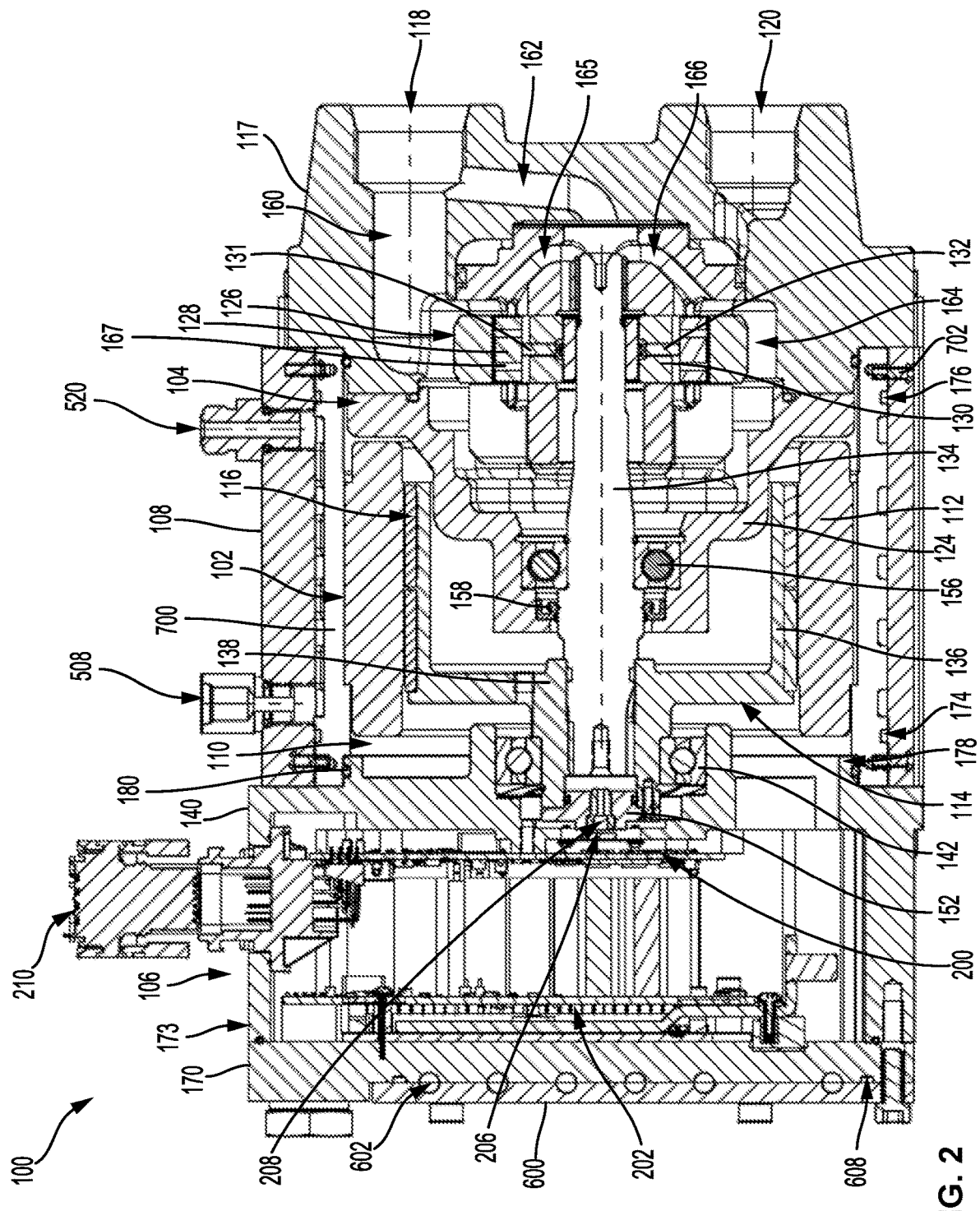
FIG. 2 illustrates a cross-sectional side view of the assembly of FIG. 1, in accordance with an example implementation.
Figure 3:
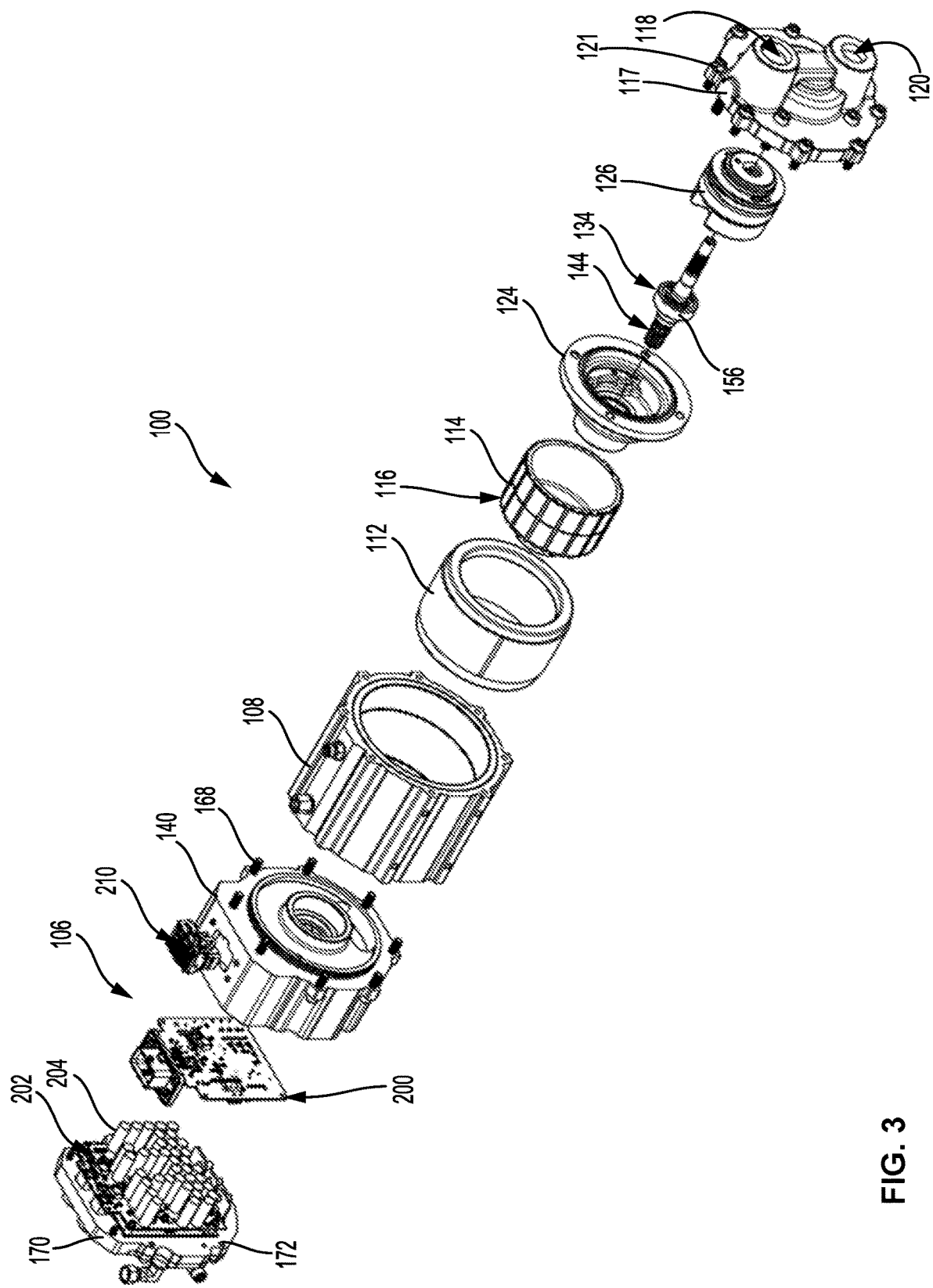
FIG. 3 illustrates a perspective exploded view of the assembly of FIG. 1, in accordance with another example implementation.

FIG. 1 illustrates a perspective view of an assembly 100, FIG. 2 illustrates a cross-sectional side view of the assembly 100, and FIG. 3 illustrates a perspective exploded view of the assembly 100, in accordance with an example implementation. FIGS. 1-3 are described together.

The assembly 100 comprises an electric motor 102, a hydraulic pump 104, and an electronic drive device 106 integrated together. The assembly 100 includes a main housing 108 having an internal chamber 110 therein in which components of the electric motor 102 and the hydraulic pump 104 are disposed.

The electric motor 102 includes a stator 112 fixedly-positioned within the internal chamber 110 of the main housing 108. The stator 112 is configured to generate a magnetic field. Particularly, the stator 112 can include wire windings (not shown) wrapped about a body (e.g., a lamination stack) of the stator 112, and when electric current is provided through the wire windings, a magnetic field is generated.

The electric motor 102 further includes a motor rotor 114 positioned within the stator 112. The electric motor 102 can further include magnets 116 mounted to the motor rotor 114 in an annular space between the stator 112 and the motor rotor 114. In an example, the magnets 116 include two circumferential arrays of magnets axially-spaced and disposed about the motor rotor 114 as shown in FIG. 3.

The magnets 116 are configured to interact with the magnetic field generated by the stator 112 in order to rotate the motor rotor 114 and produce torque. In other example implementation, a different type of electric motor might be used that does not include permanent magnets.

The hydraulic pump 104 is mounted within the main housing 108 and, at least partially, within the motor rotor 114 and the stator 112 of the electric motor 102. The assembly 100 has a pump port block 117 having an inlet port 118 and an outlet port 120. The pump port block 117 is coupled to the main housing 108 via a plurality of fasteners or bolts such as bolt 121 (see FIGS. 1 and 3).

The hydraulic pump 104 can be configured, for example, as a vane pump. Particularly, the hydraulic pump 104 has a pump cover 124 and a vane cartridge 126. The vane cartridge 126 has a pump housing 128, a pump rotor 130, vanes such as vane 131 and vane 132, and a pump drive shaft 134.

The motor rotor 114 has a cylindrical portion 136 and a spindle portion 138. The spindle portion 138 is supported within an electronic device housing 140 of the electronic drive device 106 via a bearing 142 disposed about an exterior surface of the spindle portion 138 of the motor rotor 114 to allow the motor rotor 114 to rotate relative to the main housing 108 and the electronic device housing 140. Further, the pump drive shaft 134 provides additional support for the motor rotor 114.

Figure 4A:
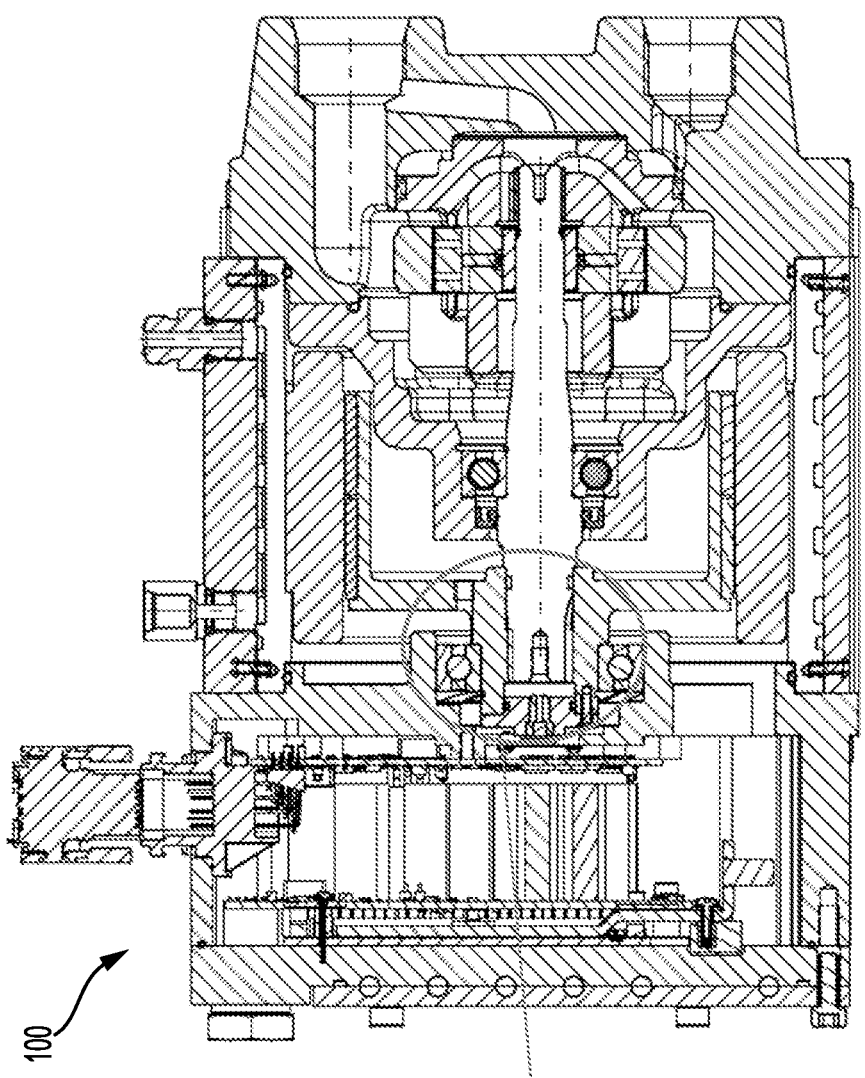
FIG. 4A illustrates the cross-sectional view of FIG. 2, in accordance with an example implementation.
Figure 4B:
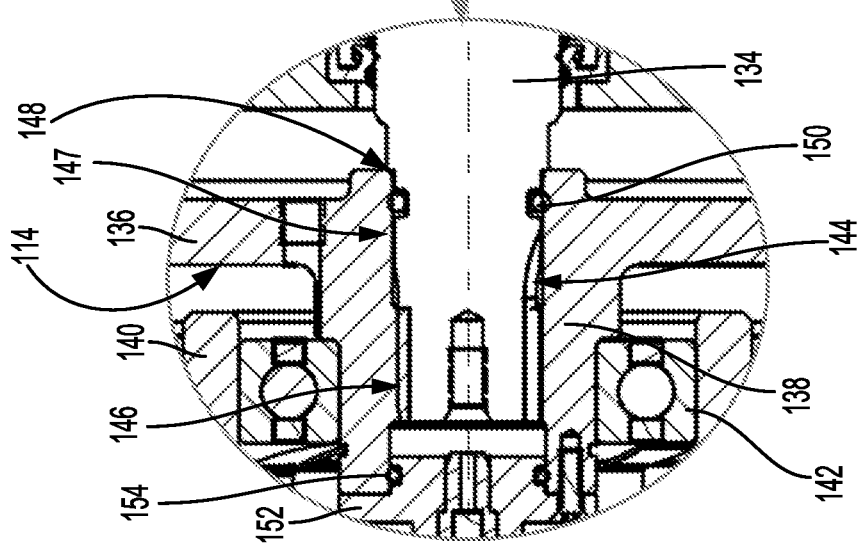
FIG. 4B illustrates a detailed sectional view showing a pump drive shaft supporting a motor rotor, in accordance with an example implementation.

FIG. 4A illustrates the cross-sectional view of FIG. 2, and FIG. 4B illustrates a detailed sectional view showing the pump drive shaft 134 supporting the motor rotor 114, in accordance with an example implementation. Particularly, FIG. 4B is a zoomed-in view of the cross-sectional view of FIG. 4A illustrating the interface between the pump drive shaft 134 and the spindle portion 138 of the motor rotor 114.

The pump drive shaft 134 is rotatably-coupled to the motor rotor 114. Referring to FIGS. 3 and 4B together, the pump drive shaft 134 has splines 144 formed about the exterior surface of the pump drive shaft 134 and configured to engage with respective splines 146 formed on an interior surface of the spindle portion 138 of the motor rotor 114. This way, the motor rotor 114 is drivingly connected to the pump drive shaft 134 and is configured to transmit rotary motion to the pump drive shaft 134 during operation of the assembly 100.

As mentioned above, the motor rotor 114, and particularly the spindle portion 138 thereof, is supported about its exterior surface via the bearing 142. Additionally, the pump drive shaft 134 has an increased diameter portion 147 and shoulder 148 that provide support for the interior surface of the spindle portion 138 of the motor rotor 114 as shown in FIG. 4B. As such, the motor rotor 114 is supported at two areas or points: an area about its exterior surfaces supported by the bearing 142 and an area about its interior surface where the motor rotor 114 is supported by the pump drive shaft 134. With this configuration, the pump drive shaft 134 provides an extended support for the motor rotor 114 and may preclude misalignments or twisting of the motor rotor 114 during operation.

During operation, as the motor rotor 114 rotates, the spline engagement with the pump drive shaft 134 causes the rotary motion of the motor rotor 114 to be transmitted to the pump drive shaft 134. It may be desirable to maintain the spline engagement between the splines 146 and the splines 144 lubricated. Such lubrication elongates the life of the components (e.g., the motor rotor 114 and the pump drive shaft 134) of the assembly 100. For example, grease may be used to lubricate the spline engagement between the splines 146 and the splines 144.

It may be desirable to maintain the grease or any lubrication fluid at the area of spline engagement. As such, the assembly 100 includes a first seal 150 (e.g., an O-ring) disposed in a groove formed about an exterior surface of the pump drive shaft 134. Further, the assembly 100 includes a cap 152 inserted within the spindle portion 138 of the motor rotor 114, and the cap 152 has a second seal 154 (e.g., an O-ring) disposed in a groove formed about a respective exterior surface of the cap 152.

The first seal 150 and the second seal 154 straddle the splines 144, 146. This way, any lubricant at the area of spline engagement between the splines 146 and the splines 144 is sealed and remains between the first seal 150 and the second seal 154. With this configuration, the lubricant might not leak outside the area of spline engagement.

Referring back to FIGS. 2-3, the assembly 100 further includes another bearing 156 disposed about the exterior surface of, and provides support to, the pump drive shaft 134. Particularly, the bearing 156 is disposed between the exterior surface of the pump drive shaft 134 and the interior surface of the pump cover 124 and allows the pump drive shaft 134 to rotate relative to the pump cover 124. The assembly further includes a shaft seal 158 also disposed between the exterior surface of the pump drive shaft 134 and the interior surface of the pump cover 124 and configured to preclude leakage of fluid from the hydraulic pump 104 into the electric motor 102.

Referring to FIG. 2, fluid received at the inlet port 118 flows through a first feeding passage 160 and a second feeding passage 162. Fluid flows from the first feeding passage 160 to a pump chamber 164. Fluid also flows from the second feeding passage 162, through arcuate fluid passage 165 and arcuate fluid passage 166 formed in the vane cartridge 126 to join fluid from the first feeding passage 160 at the pump chamber 164.

Having two feeding passages, rather than one, may advantageously increase the feeding capacity to the hydraulic pump 104. As more fluid is being fed to the hydraulic pump 104, the likelihood of occurrence of cavitation is decreased or eliminated.

The pump rotor 130 is configured to be eccentrically supported within the pump housing 128, which may have a cycloidal interior surface. The pump rotor 130 is located close to the interior surface wall of the pump housing 128 such that a crescent-shaped cavity is formed therebetween. The vanes, such as the vanes 131, 132 fit within slots in the pump rotor 130.

As the pump drive shaft 134 rotates (when the motor rotor 114 rotates), the pump rotor 130 also rotates. As the pump rotor 130 rotates, centrifugal force, hydraulic pressure, push-rods, and/or springs push the vanes 131, 132 radially-outward toward the interior surface of the pump housing 128. Fluid is then forced or sucked from the pump chamber 164 into the pump housing 128 via holes such as hole 167 shown in FIG. 2. Particularly, fluid enters pockets created by the vanes 131, 132, the pump rotor 130, and the pump housing 128.

As the pump rotor 130 continues rotating, the vanes 131, 132 sweep the fluid to the opposite side of the crescent-shaped cavity where it is squeezed through discharge holes in the pump housing 128. Fluid is then forced to the outlet port 120 from which where fluid exits the assembly 100. Fluid is then provided to an actuator fluidly-coupled to the assembly 100 as described below with respect to FIGS. 10-11.

A vane pump is used herein as an example for illustration. It should be understood that other types of pumps such as a gear pump or a piston pump can be used as well.

Referring to FIG. 3, the electronic device housing 140 is coupled to the main housing via bolts such as bolt 168. The electronic device housing 140 is further coupled to an electronics housing cover 170 via a plurality of bolts, such as bolt 172. With this configuration, the electronic device housing 140 and the electronics housing cover 170 form an enclosure 173 in which electronic boards and components of the electronic drive device 106 are disposed. This way, the electronic drive device 106 is integrated with the electric motor 102 and the hydraulic pump 104 in the assembly 100.

The electronic drive device 106 can include one or more electronic boards such as a controller board 200 and an inverter board 202 that are electrically-coupled and axially-offset from each other as depicted. The controller board 200 and the inverter board 202 can be configured as printed circuit boards (PCBs). A PCB mechanically supports and electrically connects electronic components (e.g., microprocessors, integrated chips, capacitors, resistors, etc.) using conductive tracks, pads, and other features etched from one or more sheet layers of copper laminate onto and/or between sheet layers of a nonconductive substrate. Components are generally soldered onto the PCB to both electrically connect and mechanically fasten them to it.

The inverter board 202 can be separated from, and coupled to, the controller board 200 via stand-offs such as stand-off 204 shown in FIG. 3. The inverter board 202 can include a plurality of bus bars that are electrically-conductive and are configured to receive direct current (DC) power and provide the power to components mounted to the inverter board 202.

As an example, the DC power can be provided to the inverter board 202 from a battery. With this configuration, DC power is provided to the bus bars, which then transmit the power to other components of the inverter board 202.

The inverter board 202 can be configured as a power converter that converts DC power received at the inverter board 202 to three-phase, alternating current (AC) power that can be provided to wire windings of the stator 112 to drive the electric motor 102. For example, the inverter board 202 can include a semiconductor switching matrix mounted to the inverter board 202 and configured to be electrically-connected to a positive DC terminal and to a negative DC terminal. The inverter board 202 can further include a plurality of capacitors disposed in the axial space between the inverter board 202 and the controller board 200.

The semiconductor switching matrix can include any arrangement of semiconductor switching devices that supports DC to three-phase power conversion. For example, the semiconductor switching matrix can include a three-phase, with bridge elements electrically-coupled to input DC terminals and connected to three-phase AC output terminals.

In an example, the semiconductor switching matrix includes a plurality of transistors (e.g., an Insulated Gate Bipolar Transistor or a metal-oxide-semiconductor field-effect transistor). The transistors are switchable between an activated or "on" state and a deactivated or "off" state, e.g., via a pulse width modulated (PWM) signal provided by a microprocessor mounted to the controller board 200. A microprocessor can comprise one or more processors. A processor can include a general purpose processor (e.g., an INTEL® single core microprocessor or an INTEL® multi-core microprocessor), or a special purpose processor (e.g., a digital signal processor, a graphics processor, or an application specific integrated circuit (ASIC) processor). A processor can be configured to execute computer-readable program instructions (CRPI) to perform the operations described throughout herein. A processor can be configured to execute hard-coded functionality in addition to or as an alternative to software-coded functionality (e.g., via CRPI).

As the transistors of the semiconductor switching matrix are activated and deactivated at particular times via the PWM signal, AC voltage waveforms are generated at the AC output terminals. As such, the voltage waveforms at the AC output terminals are pulse width modulated and swing between voltage potential DC+ and voltage potential DC−. The AC voltage waveforms are then provided to the wire windings of the stator 112 to drive the electric motor 102.

The controller board 200 and the inverter board 202 can include several junctions to facilitate receiving and transmitting signals and power therebetween and to other components of the assembly 100 or external components.

The electronic drive device 106 can include a plurality of sensors. For example, the electronic drive device 106 can include temperature sensors configured to provide information indicative of an operating temperature of the electric motor 102 and/or the fluid temperature of hydraulic fluid flowing through the hydraulic pump 104. Another temperature sensor may be mounted to the inverter board 202 to indicate a temperature of the inverter board 202. The electronic drive device 106 can also include Hall-Effect current sensors that provide information indicative of electric current level in windings of the stator 112.

The electronic drive device 106 can further include a pressure sensor indicative of pressure level of fluid within the assembly 100. The electronic drive device 106 can also include a rotary position sensor configured to provide sensor information indicative of angular position of the motor rotor 114 and the pump drive shaft 134. The rotary position sensor information can be used by the microprocessor controlling the electric motor 102 so as to control speed and torque produced by the motor rotor 114 in a closed-loop feedback control configuration.

For example, the controller board 200 can include a sensor chip or encoder 206 to be mounted near the spindle portion 138 of the motor rotor 114 as show in FIG. 2. The encoder 206 can be configured to interact with a magnet 208 disposed in the cap 152. The encoder 206 is configured as an electro-mechanical device that converts the angular position or motion of the motor rotor 114 to analog or digital output signals that are provided to the microprocessor controlling the electric motor 102. In an example implementation, to enhance accuracy of the sensor information provided by the encoder 206, the magnetic polarity of the magnet 208 is aligned with, or have the same orientation as, respective magnetic polarity of respective magnets (i.e., the magnets 116) of the electric motor 102.

As shown in FIGS. 1-3, the electronic drive device 106 can further include an electric connector 210 configured as a hollow plastic component housing a plurality of conductor pins that are electrically-connected to the conductive tracks of the controller board 200. A connector socket (not shown) having female pins can be mounted to or inserted into the electric connector 210 such that the conductor pins contact the female pins of the connector socket. Wires can be connected to the female pins so as to provide signals to, and receive signals from, the conductor pins of the electric connector 210.

With this configuration, the electronic drive device 106 can receive via the electric connector 210 various inputs and sensor signals and provide commands in response to the received information. For example, the electronic drive device 106 can receive a command signal from a central controller or from an input device of a machine (e.g., a joystick of a hydraulic machine such as a wheel loader, backhoe, or excavator) indicative of a desired fluid pressure and fluid flow rate to be provided by the hydraulic pump 104. The electronic drive device 106 can then control the AC power provided to the stator 112 to generate a particular speed and torque at the pump drive shaft 134 to provide the desired fluid pressure level and flow rate. The electronic drive device 106 can also provide sensor signals (e.g., from the encoder 206) to another central controller via the electric connector 210.

As such, the electronic drive device 106 can be used as a controller for the assembly 100 as well as the actuator controlled by the assembly 100. Particularly, the electronic drive device 106 receives command inputs and sensor signals from sensors internal to the assembly 100 and sensors associated with the actuator, and responsively controls the electric motor 102 and the hydraulic pump 104 to achieve desired or commanded motion of the actuator.

During operation of the assembly 100, heat is generated by the electric motor 102 and the heat is distributed throughout multiple components within the electric motor 102. For example, heat is generated due to losses within the stator slot-windings, stator end-windings, stator laminations, rotor laminations, and rotor magnets or conductors. The distribution of the generated heat within the components is dependent on the motor type and the operating condition (torque/speed) of the motor. The heat generated within the electric motor 102 can raise the internal temperature, making the coil of the electric motor 102 more susceptible to burn out. It may thus be desirable to cool the electric motor 102 to preclude the temperature from exceeding a threshold safe temperature.

Further, during operation, as the inverter board 202 converts DC power to AC power, it generates heat. This heat is added to the ambient temperature of the enclosure 173 formed by the electronic device housing 140 and the electronics housing cover 170. The hotter the inverter board 202 and the enclosure 173 become, the less AC power the inverter board 202 delivers. As such, it may be desirable to also cool the enclosure 173 and the inverter board 202. The assembly 100 is configured to receive cooling fluid from an external source and route the cooling fluid to both the enclosure 173 (e.g., the electronics housing cover 170) to cool the inverter board 202 and to the main housing 108 to cool the electric motor 102.

Figure 5:
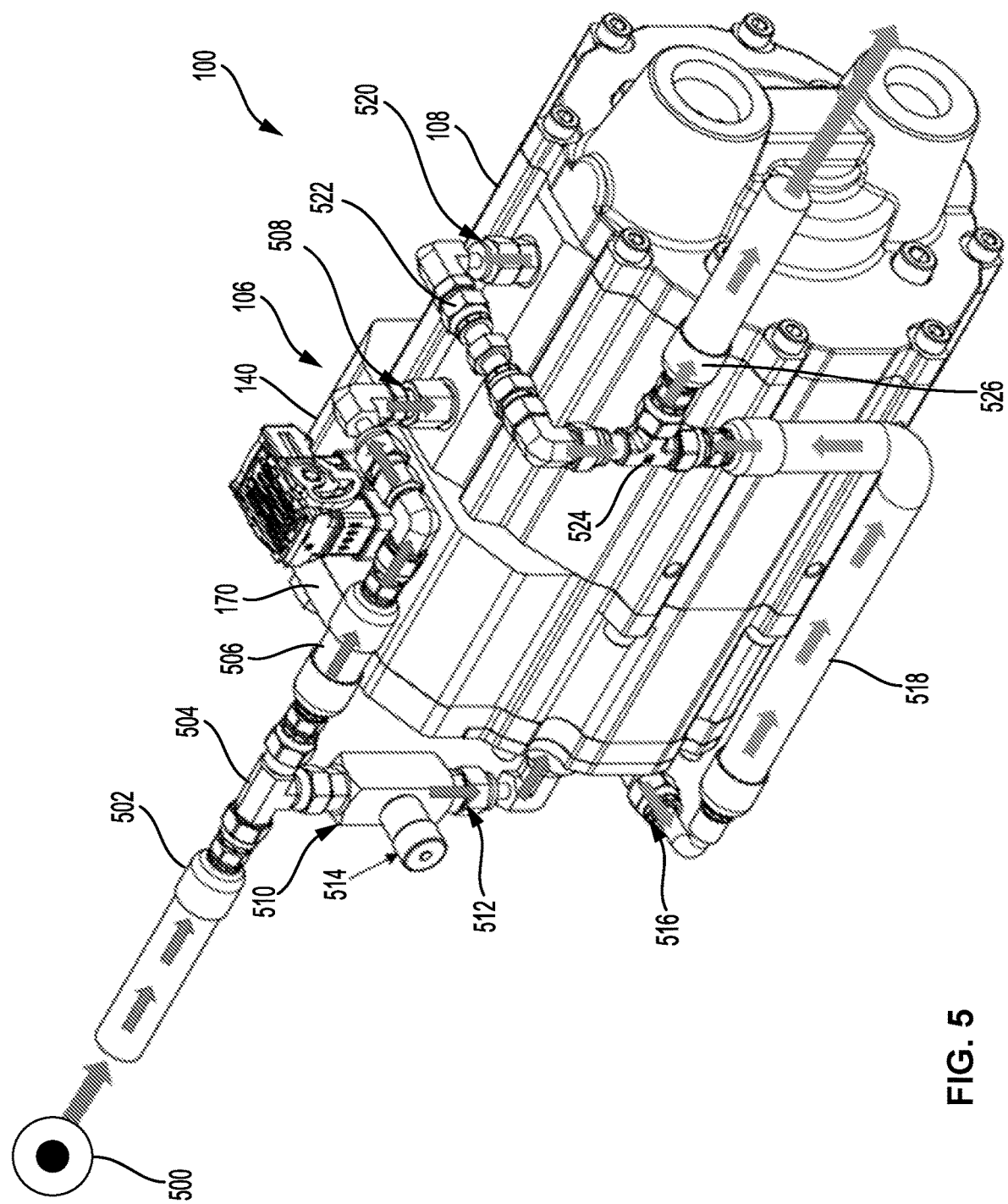
FIG. 5 illustrates a perspective view of the assembly of FIG. 1 depicting cooling fluid paths, in accordance with an example implementation.

FIG. 5 illustrates a perspective view of the assembly 100 depicting cooling fluid paths, in accordance with an example implementation. The assembly 100 is configured to receive cooling fluid from an external source 500 of cooling fluid.

In an example, the external source 500 can be a pump that draws cooling fluid such as water glycol from a fluid reservoir and displaces the cooling fluid to the assembly 100. In another example, the external source 500 can be another hydraulic circuit (e.g., see boost circuit 404 in FIG. 12 described below) included in the hydraulic system comprising the assembly 100.

In another example, as discussed below with respect to FIG. 11, the external source 500 can be a hydraulic actuator (e.g., a hydraulic cylinder or hydraulic motor) included in the hydraulic system. In this example, a portion of the fluid discharged from the hydraulic actuator is routed to the assembly 100 for cooling while a remaining amount of fluid discharged from the hydraulic actuator flows to a fluid reservoir (e.g., a fluid tank).

Cooling fluid from the external source 500 is provided through a fluid line 502 (e.g., a hose, tube, pipe, etc.) to a junction 504. At the junction 504, the cooling fluid is divided or branched such that a portion of the cooling fluid branches out to flow through a fluid line 506 to a motor cooling fluid inlet port 508, while another portion flows through a flow control valve 510 to an inverter cooling fluid inlet port 512.

The flow control valve 510 is configured to apportion the cooling fluid between the electric motor 102 and the electronic drive device 106. For example, a controller (e.g., a microprocessor of the controller board 200) can be configured to receive sensor information indicative of temperature of the electric motor 102 and the temperature of the inverter board 202. Based on the sensor information, the controller determines whether to provide more cooling fluid to the electric motor 102 or the electronic drive device 106. Based on the determination, the controller provides a signal to a solenoid 514, for example, to operate the flow control valve 510 so as to increase or decrease fluid resistance in the path of fluid provided to the inverter cooling fluid inlet port 512. This way, cooling fluid can be apportioned between the electric motor 102 and the electronic drive device 106 based on cooling requirements.

In an example, the flow control valve 510 can be manually-operated. In another example, the assembly 100 might not include the flow control valve 510.

Fluid provided to the inverter cooling fluid inlet port 512 circulates within the enclosure 173 (e.g., through the electronics housing cover 170), thereby absorbing heat generated by the inverter board 202, and is then provided to an inverter cooling fluid outlet port 516 from which cooling fluid is discharged to fluid line 518. Similarly, fluid provided to the motor cooling fluid inlet port 508 circulates around the electric motor 102 (e.g., about the main housing 108), thereby absorbing heat generated by the electric motor 102, and is then provided to a motor cooling fluid outlet port 520 from which cooling fluid is discharged to fluid line 522.

Fluid from the fluid line 522 merges with fluid from the fluid line 518 at junction 524, and fluid is then provided to fluid line 526, which can be fluidly-coupled to a fluid reservoir. The fluid reservoir can be a fluid reservoir dedicated to the cooling fluid or can be a fluid reservoir of hydraulic fluid of the hydraulic system.

The several fluid lines depicted in FIG. 5 can include multiple fittings as appropriate. Further, although the fluid lines or paths of the cooling fluid and other components such as the flow control valve 510 are depicted as being external to the assembly 100, it is contemplated that at least some of the fluid paths or components can be embedded within the assembly 100.

Figure 6B:
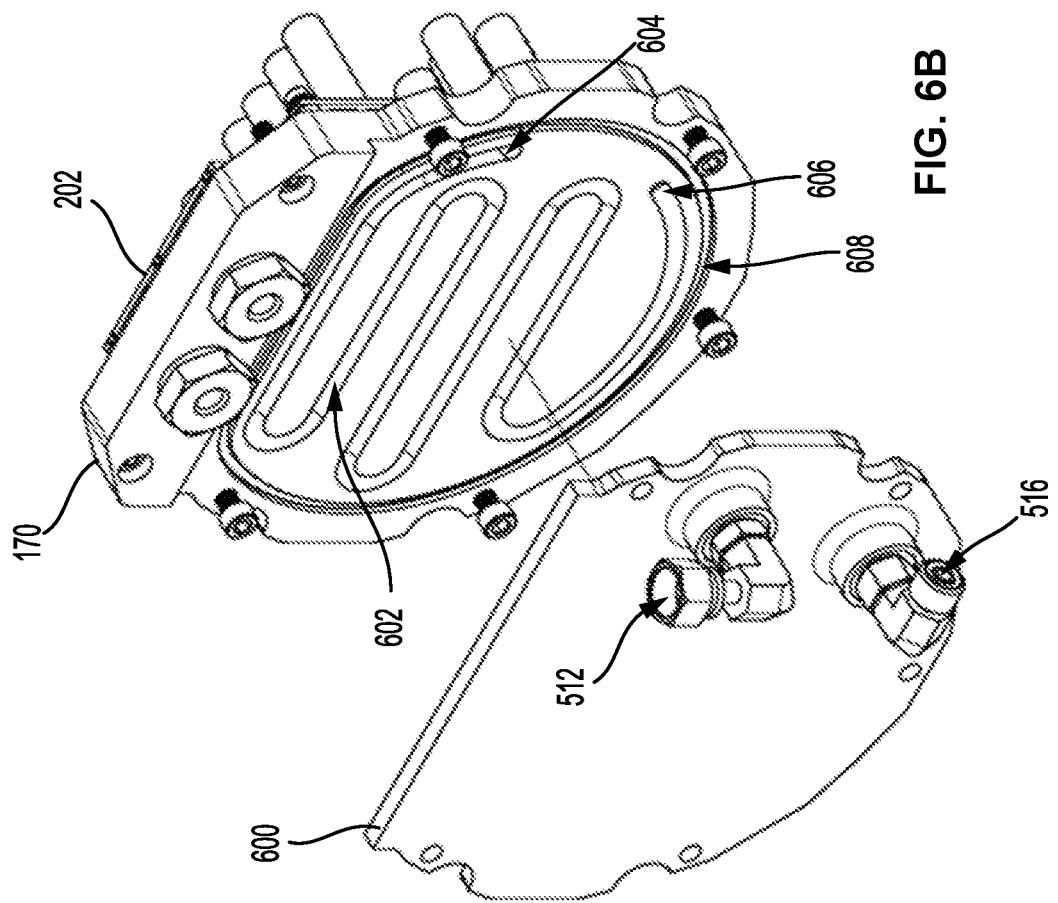
FIG. 6B illustrates a partial perspective exploded view of the assembly of FIG. 1 showing the inverter cover and the back plate, in accordance with an example implementation.
Figure 6A:
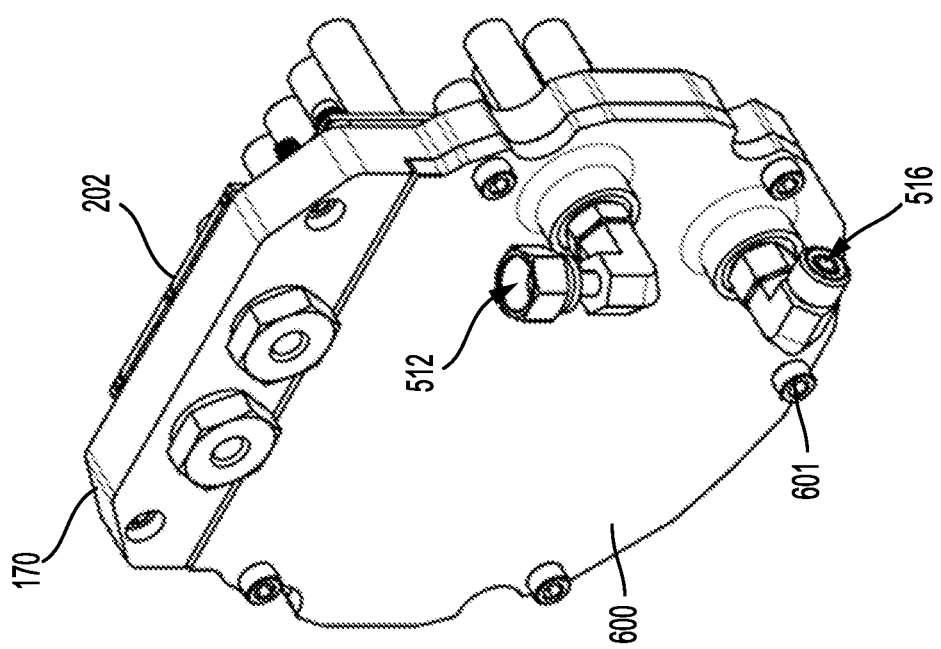
FIG. 6A illustrates a partial perspective view of the assembly of FIG. 1 showing an inverter cover and a back plate, in accordance with an example implementation.

FIG. 6A illustrates a partial perspective view of the assembly 100 showing the electronics housing cover 170 and a back plate 600, and FIG. 6B illustrates a partial perspective exploded view of the assembly 100 showing the electronics housing cover 170 and the back plate 600, in accordance with an example implementation. The back plate 600 can be coupled to the electronics housing cover 170 via a plurality of fasteners such as fastener 601.

The enclosure 173 is configured to have one or more inverter cooling fluid channels to cool the inverter board 202. For example, fluid provided from the external source 500 shown in FIG. 5 is provided to the inverter cooling fluid inlet port 512 (via the flow control valve 510), and fluid is then provided to an inverter cooling fluid channel 602 formed in the electronics housing cover 170 and the back plate 600. For example, fluid received at the inverter cooling fluid inlet port 512 can be provided to a first end 604 of the inverter cooling fluid channel 602 (e.g., the inlet opening in the back plate 600 is aligned with the first end 604). The cooling fluid then traverses the inverter cooling fluid channel 602 until it reaches a second end 606 of the inverter cooling fluid channel 602. The second end 606 can be aligned with an outlet opening in the back plate 600, where the outlet opening provides fluid to the inverter cooling fluid outlet port 516.

As depicted, the inverter cooling fluid channel 602 zig-zags or loops through the electronics housing cover 170. This way, the surface area through which heat is dissipated is increased.

In an example, the inverter cooling fluid channel 602 is formed in the electronics housing cover 170 only. In another example, a portion of the inverter cooling fluid channel 602 is formed in the electronics housing cover 170 and another mating portion of the inverter cooling fluid channel 602 is formed in the back plate 600. For example, as depicted in FIG. 2, if the inverter cooling fluid channel 602 comprises a cylindrical fluid passage or conduit, half the conduit can be formed in the electronics housing cover 170 and the other mating half is formed in the back plate 600.

The electronics housing cover 170 can further include a seal groove 608 in which a seal (e.g., an O-ring) can be disposed. Such seal is configured to seal the cooling fluid flowing through the inverter cooling fluid channel 602 and precludes leakage of cooling fluid to an external environment of the assembly 100, i.e., fluid is contained at the interface between the electronics housing cover 170 and the back plate 600.

While the inverter cooling fluid channel 602 is shown in FIGS. 6A-6B as being formed in the electronics housing cover 170 and the back plate 600, other configurations are possible. The cooling channel can be formed anywhere through the enclosure 173 (i.e., can be formed in one or more of the back plate 600, the electronics housing cover 170, or the electronic device housing 140) such that the cooling fluid circulates about the inverter board 202 and absorbs heat generated therefrom.

Figure 7A:
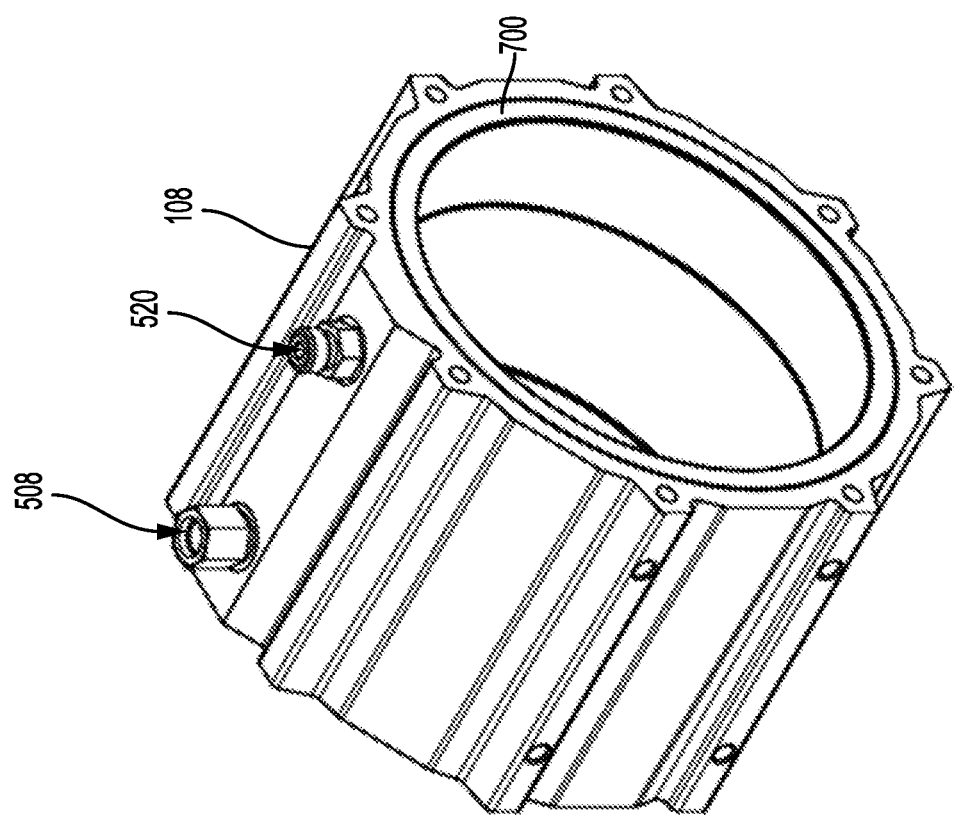
FIG. 7A illustrates a partial perspective view of the assembly of FIG. 1 showing a main housing and a cooling inner ring disposed therein, in accordance with an example implementation.
Figure 7B:
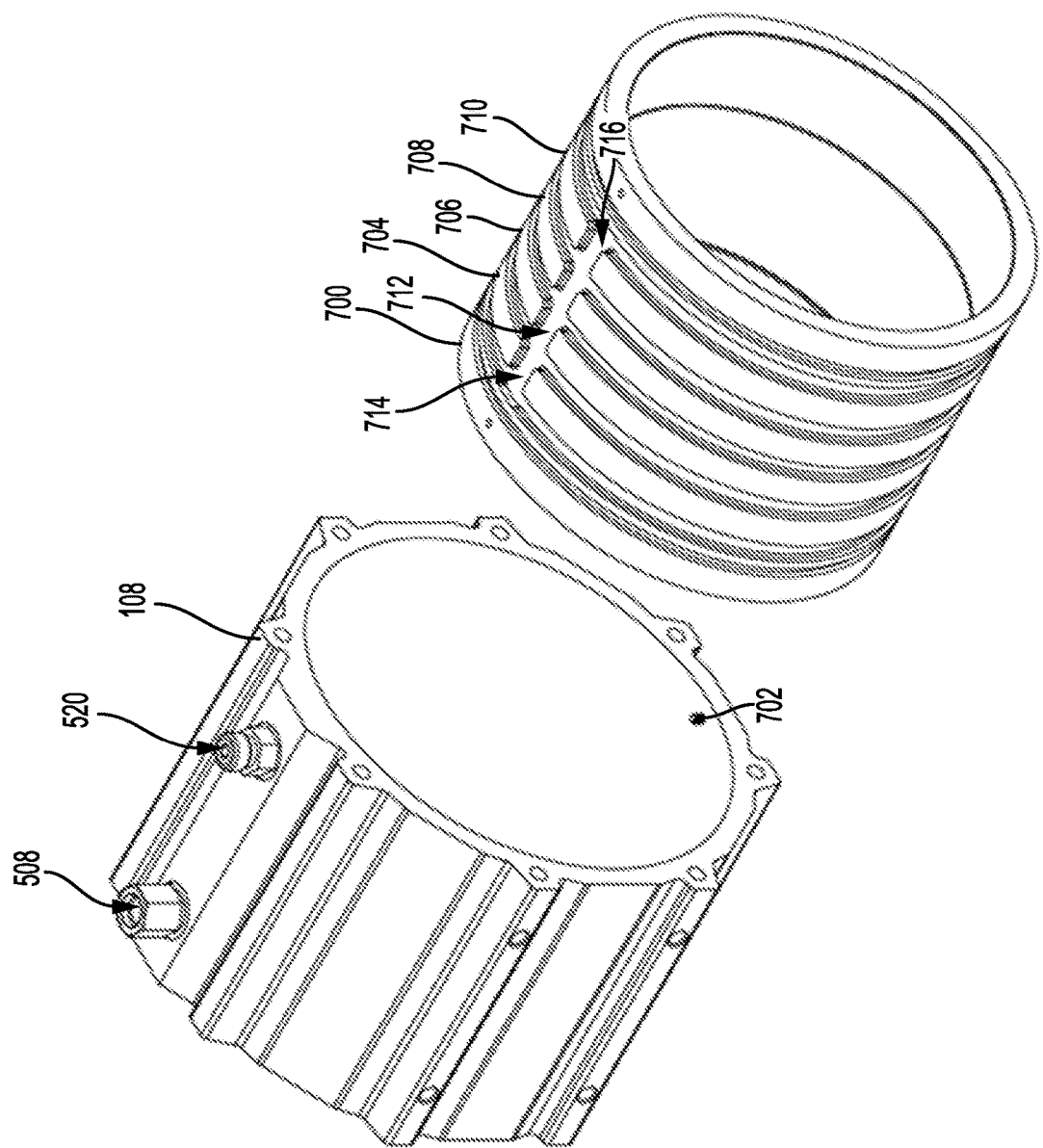
FIG. 7B illustrates a partial perspective exploded view of the assembly of FIG. 1 showing the main housing and the cooling inner ring, in accordance with an example implementation.

FIG. 7A illustrates a partial perspective view of the assembly 100 showing the main housing 108 and a cooling inner ring 700 disposed therein, and FIG. 7B illustrates a partial perspective exploded view of the assembly 100 showing the main housing 108 and the cooling inner ring 700, in accordance with an example implementation. The cooling inner ring 700 is retained within the main housing 108 via retaining pins such as retaining pin 702, which is configured to extend into a hole made in the cooling inner ring 700 (see FIG. 2) to retain it to the main housing 108.

The cooling inner ring 700 is configured to having one or more motor cooling fluid channels providing cooling paths for the cooling fluid received at the motor cooling fluid inlet port 508 of the main housing 108. Particularly, as shown in FIG. 7B, the cooling inner ring 700 can have a plurality of arcuate protrusions or arcuate ridges such as arcuate ridge 704, arcuate ridge 706, arcuate ridge 708, and arcuate ridge 710. The cooling inner ring 700 can also have another set of arcuate ridges opposite the arcuate ridges 704-710, as shown in FIG. 7B, such that a motor cooling fluid channel 712 is formed therebetween.

Cooling fluid received via the motor cooling fluid inlet port 508 is provided to the cooling inner ring 700 at an inlet end 714 of the motor cooling fluid channel 712. Cooling fluid has several path to traverse thereafter under pressure from the external source 500 providing the cooling fluid. For example, cooling fluid can traverse the motor cooling fluid channel 712 to an outlet end 716 of the motor cooling fluid channel 712.

Further, cooling fluid can traverse an exterior surface of the cooling inner ring 700 through arcuate motor cooling fluid channels formed between the arcuate ridges 704-710, for example. Such arcuate motor cooling fluid channels form parallel paths for the cooling fluid to traverse while absorbing heat throughout the surfaces of the arcuate ridges 704-710.

Under pressure from the external source 500, cooling fluid traverses the various paths or channels of the cooling inner ring 700 and reaches the outlet end 716, which is aligned with the motor cooling fluid outlet port 520. Fluid is then discharged from the motor cooling fluid outlet port 520, and flows through the fluid line 522 to merge with the cooling fluid that has traversed the electronics housing cover 170 as described above with respect to FIG. 5.

Although FIG. 7B illustrates the cooling inner ring 700 having parallel paths (e.g., arcuate channels between the arcuate ridges 704-710), the cooling inner ring 700 can be configured differently. For instance, another cooling inner ring can have a serial path (e.g., one spiral or zigzagging motor cooling fluid channel). Another cooling inner ring may have protrusion of various shapes to increase the surface area through which heat is dissipated.

Figure 8:
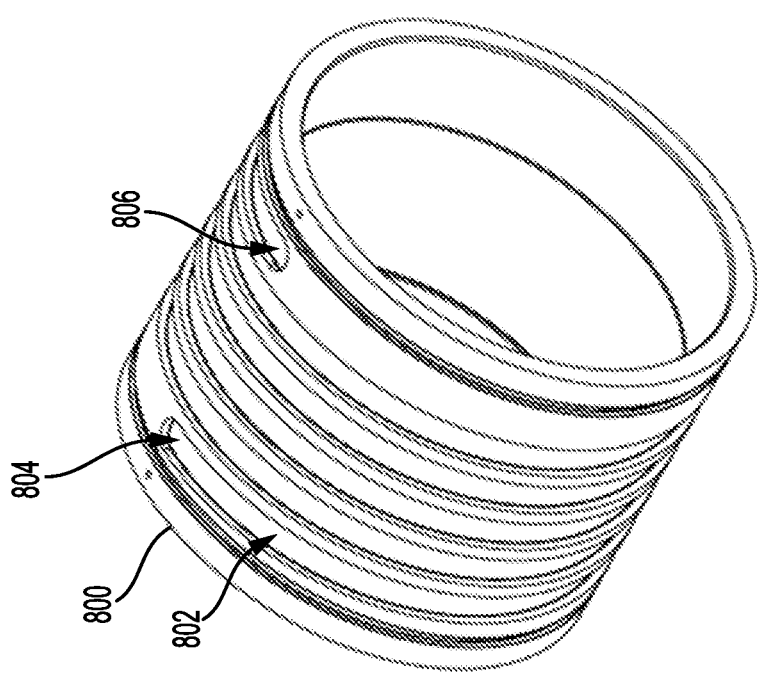
FIG. 8 illustrates a perspective view of another cooling inner ring, in accordance with an example implementation.

FIG. 8 illustrates a perspective view of another cooling inner ring 800, in accordance with an example implementation. The cooling inner ring 800 has a spiral motor cooling fluid channel 802 that is formed as a looping depression about the exterior surface of the cooling inner ring 800. The spiral motor cooling fluid channel 802 has an inlet end 804 aligned with the motor cooling fluid inlet port 508 to receive cooling fluid therefrom. Cooling fluid then circulates about the exterior surface of the cooling inner ring 800, and the side surfaces of the spiral motor cooling fluid channel 802 may increase the surface area through which heat is dissipated to the cooling fluid.

Fluid then reaches an outlet end 806, which is aligned with the motor cooling fluid outlet port 520. Fluid is then discharged from the motor cooling fluid outlet port 520, and flows through the fluid line 522 to merge with the cooling fluid that has traversed the electronics housing cover 170 as described above with respect to FIG. 5.

Figure 9:
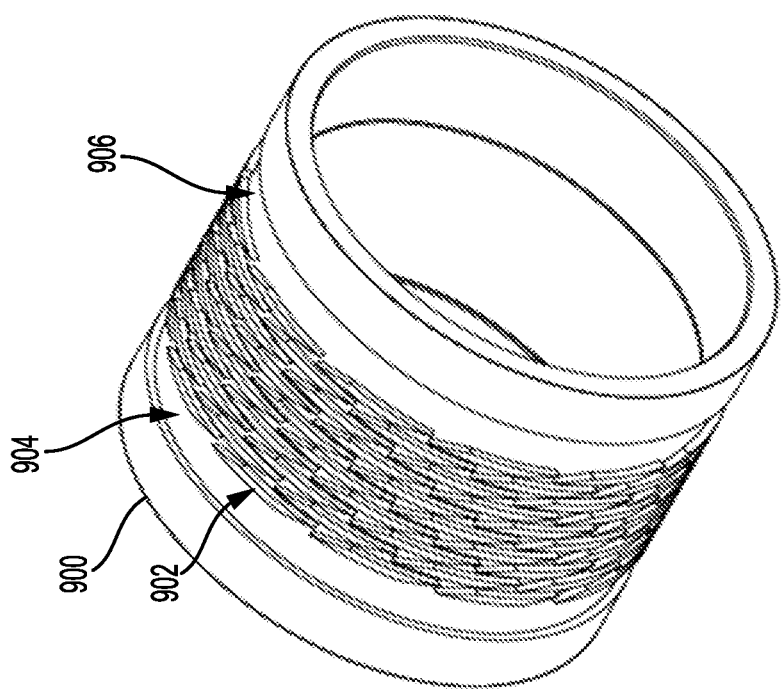
FIG. 9 illustrates a perspective view of another cooling inner ring, in accordance with an example implementation.

FIG. 9 illustrates a perspective view of another cooling inner ring 900, in accordance with an example implementation. The cooling inner ring 900 has a plurality protrusions 902 having a polygonal shape (e.g., closed plane shape bounded by straight sides such a quadrilateral, a pentagon, a hexagon, etc.).

The protrusions 902 are interposed longitudinally (i.e., along a longitudinal axis of the cooling inner ring 900) between an inlet circular channel 904 and an outlet circular channel 906. The inlet circular channel 904 receives cooling fluid from the motor cooling fluid inlet port 508, and cooling fluid is discharged from the outlet circular channel 906 to the motor cooling fluid outlet port 520.

Due to the configuration of the protrusions 902 being polygonal in shape, various cooling paths are formed therebetween. Fluid received at the motor cooling fluid inlet port 508 is provided to the inlet circular channel 904, and the cooling fluid is then diffused throughout the various motor cooling fluid channels/paths formed between the protrusions 902. The multiple raised sides of each protrusion may increase the surface area through which heat is dissipated and absorbed by the cooling fluid.

Under pressure from the external source 500, fluid is diffused through the protrusions 902 until it reaches the outlet circular channel 906, which is aligned with the motor cooling fluid outlet port 520. Fluid is then discharged from the motor cooling fluid outlet port 520, and flows through the fluid line 522 to merge with the cooling fluid that has traversed the electronics housing cover 170 as described above with respect to FIG. 5.

Figure 10:
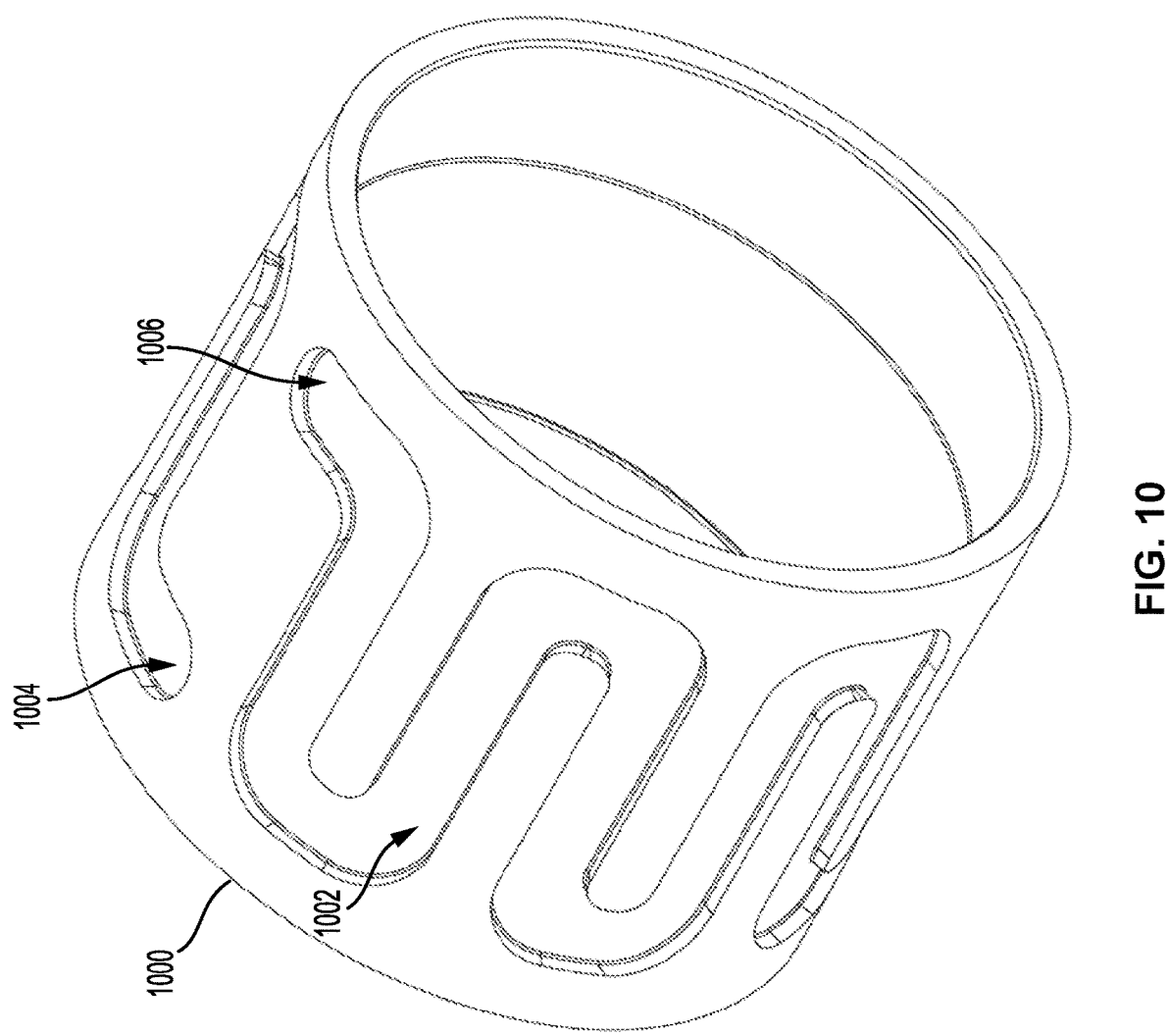
FIG. 10 illustrates a perspective view of another cooling inner ring, in accordance with an example implementation.

FIG. 10 illustrates a perspective view of another cooling inner ring 1000, in accordance with an example implementation. The cooling inner ring 1000 has a zigzagging motor cooling fluid channel 1002 that is formed as a depression that zigzags longitudinally as it traverses an exterior surface of the cooling inner ring 1000. The zigzagging motor cooling fluid channel 1002 has an inlet end 1004 aligned with the motor cooling fluid inlet port 508 to receive cooling fluid therefrom.

Under pressure from the external source 500, cooling fluid circulates and zigzags about the exterior surface of the cooling inner ring 1000 as it traverses the zigzagging motor cooling fluid channel 1002. The side surfaces of the zigzagging motor cooling fluid channel 1002 may increase the surface area through which heat is dissipated to the cooling fluid.

Fluid then reaches an outlet end 1006, which is aligned with the motor cooling fluid outlet port 520. Fluid is then discharged from the motor cooling fluid outlet port 520, and flows through the fluid line 522 to merge with the cooling fluid that has traversed the electronics housing cover 170 as described above with respect to FIG. 5.

Referring back to FIG. 2, the assembly 100 is depicted with the cooling inner ring 700. However, it should be understood that the cooling inner rings 800, 900, 1000 could be used.

Further, in other example implementations, the cooling channels may be formed within the main housing 108. In these examples, the cooling inner ring might not be used; rather, the main housing 108 operates as a cooling jacket with cooling channels formed therethrough. Any other configuration in which cooling fluid is allowed to circulate through a cooling fluid channel about the electric motor 102 to absorb heat generated therefrom can be used.

As shown in FIG. 2, the cooling inner ring 700 has external annular grooves at both ends, such as annular groove 174 and annular groove 176. The annular grooves 174, 176 are configured to receive seals such as O-rings (not shown) to seal the cooling fluid between the main housing 108 and the cooling inner ring 700.

Further, the main housing 108 is mounted to the electronic device housing 140, wherein the electronic device housing 140 has a cylindrical protrusion 178, the exterior surface of which interfaces with an interior surface of the main housing 108. Another seal 180 disposed in an annular groove formed in the exterior surface of the cylindrical protrusion 178 can further seal the cooling fluid and preclude it from entering the internal chamber 110 in which the electric motor 102 is disposed.

As mentioned above, the external source 500 of cooling fluid can have various configurations. It can be a pump that draws cooling fluid such as water glycol from a fluid reservoir and displaces the cooling fluid to the assembly 100, or the external source 500 can be another component or circuit of the hydraulic system in which the assembly 100 is used.

Figure 11:
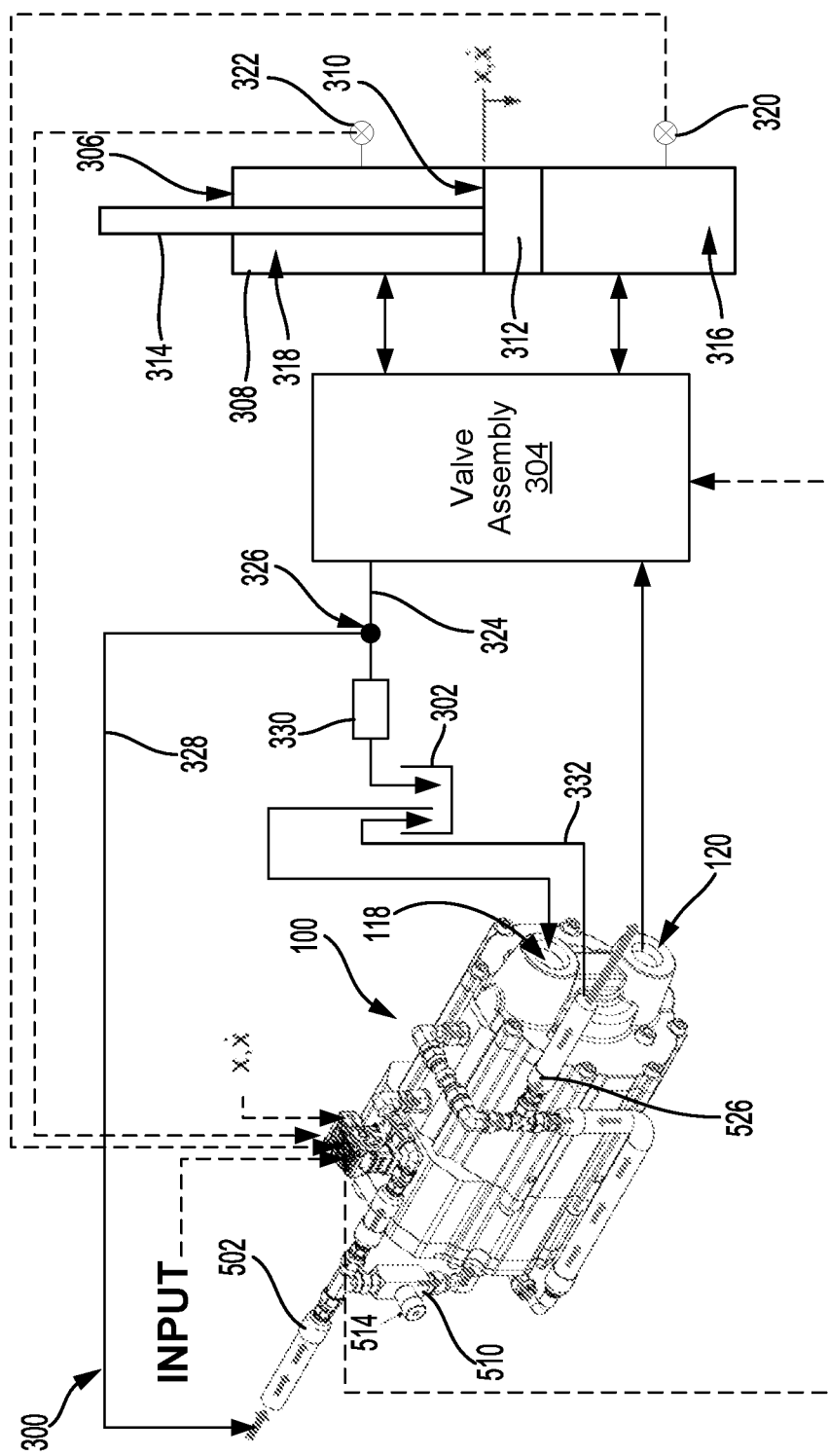
FIG. 11 illustrates a hydraulic system including the assembly of FIG. 1 operating in an open-circuit configuration, in accordance with an example implementation.

FIG. 11 illustrates a hydraulic system 300 including the assembly 100 operating in an open-circuit configuration, in accordance with an example implementation. In FIG. 11, hydraulic fluid lines are depicted as solid lines, whereas command and sensor signals are depicted in dashed lines. Also, not all signal lines are shown to reduce visual clutter in the drawing. A power source such a battery or an electric generator is configured to provide direct current power to the assembly 100. The power source is not shown to reduce visual clutter in the drawing.

The hydraulic system 300 also includes a fluid reservoir 302 of fluid that can store fluid at a low pressure, e.g., 0-70 pounds per square inch (psi). The inlet port 118 of the assembly 100 is fluidly-coupled to the fluid reservoir 302. The assembly 100 thus receives fluid from the fluid reservoir 302 through the inlet port 118, then discharges fluid through the outlet port 120 as described above.

The hydraulic system 300 also includes a manifold or valve assembly 304. The valve assembly 304 can include fluid passages and a plurality of solenoid-actuated valves (e.g., one or more directional control valves, flow control valves, load-holding valves, etc.). The solenoid-actuated valves control fluid flow through such fluid passages.

In an example, the valve assembly 304 is coupled to the assembly 100. For instance, the valve assembly 304 can be mounted to the pump port block 117. The valve assembly 304 can thus control fluid flow to and from the inlet port 118 and the outlet port 120.

The controller board 200 can include electronic valve drivers that control electric current and voltage signals provided to solenoid coils of the solenoid-actuated valves of the valve assembly 304 to control actuation and state of operation of the solenoid valves. This way, the electronic drive device 106 can be configured to control state of operation of the solenoid-actuated valves and fluid flow through the valve assembly 304.

The valve assembly 304 is configured to direct fluid flow to and from an actuator 306. The actuator 306 includes a cylinder 308 and a piston 310 slidably accommodated in the cylinder 308. The piston 310 includes a piston head 312 and a rod 314 extending from the piston head 312 along a central longitudinal axis direction of the cylinder 308. The piston head 312 divides the inside space of the cylinder 308 into a first chamber 316 and a second chamber 318.

The electronic drive device 106 of the assembly 100 can receive input information comprising sensor information via signals from various sensors or input devices in the hydraulic system 300, and in response provide electrical signals to various components of the hydraulic system 300. For example, the electronic drive device 106 can receive actuator sensor information from a position sensor and/or a velocity sensor coupled to the piston 310 information indicative of the position x and velocity ẋ of the piston 310. Additionally or alternatively, the electronic drive device 106 can receive from a pressure sensor 320 coupled to the first chamber 316 and/or a pressure sensor 322 coupled to the second chamber 318 information indicative of pressure level p of fluid in the chambers 316, 318 or indicative of a magnitude of a load applied to piston 310.

As mentioned above, the electronic drive device 106 can also receive sensor information from sensors of the assembly 100 (e.g., the encoder 206) indicative of speed of the motor rotor 114, pressure level of fluid discharged from the hydraulic pump 104, temperature of the cooling fluid, temperature of the electric motor 102, temperature of the inverter board 202, etc. The electronic drive device 106 can also receive an input (e.g., from a joystick of a machine) indicative of a commanded or desired speed for the piston 310. The electronic drive device 106 can then provide signals to the electric motor 102 of the assembly 100 and the valve assembly 304 to move the piston 310 at a desired commanded speed in a controlled manner.

For example, to extend the piston 310 (i.e., move the piston 310 up in FIG. 11), the electronic drive device 106 actuates the electric motor 102, which causes the hydraulic pump 104 to draw fluid from the fluid reservoir 302 through the inlet port 118, then provide fluid through the outlet port 120 to the valve assembly 304. The electronic drive device 106 also sends command signals to one or more valves to operate the valve assembly 304 in a first state. As a result, pressurized fluid provided from the assembly 100 via the outlet port 120 flows through the valve assembly 304 to the first chamber 316. As the piston 310 extends, fluid forced out of the second chamber 318 flows to the valve assembly 304, which directs the fluid via return line 324 to the fluid reservoir 302. The electronic drive device 106 operates the electric motor 102 at a particular speed and torque to provide a particular amount of flow to the actuator 306 at a particular pressure to move the piston 310 at a desired speed, while controlling pressure level in the first chamber 316 and/or the second chamber 318.

To retract the piston 310, the electronic drive device 106 can send command signals to one or more valves to operate the valve assembly 304 in a second state in which the valve assembly 304 directs fluid received from the outlet port 120 to the second chamber 318. As the piston 310 retracts, fluid in the first chamber 316 is forced out of the first chamber 316 to the valve assembly 304, which directs the fluid via the return line 324 to the fluid reservoir 302.

With this configuration, whether the piston 310 is extending or retracting, fluid discharged from the actuator 306 is provided via the return line 324 to the fluid reservoir 302. At the same time, the fluid discharged from the actuator 306 is also used as the cooling fluid that reduces the temperature of the electric motor 102 and the inverter board 202.

Particularly, fluid flowing through the return line 324 branches out at junction 326 to cooling fluid line 328, which is fluidly-coupled to the assembly 100 as shown in FIG. 11 to provide cooling fluid thereto (e.g., via the fluid line 502). To provide cooling fluid at a particular desired pressure (e.g., 50 psi), the hydraulic system 300 includes a valve 330 configured to allow pressure level upstream of the valve 330 (e.g., at the junction 326) to be higher than pressure level in the fluid reservoir 302.

As an example, the valve 330 can be a relief valve with a pressure setting of the desired pressure level. In another example, the valve 330 can include an orifice that restricts fluid flow therethrough, and thus allows pressure level to increase upstream. In another example, the valve 330 can include a spring-loaded check valve. Such a spring-loaded check valve can include a check element (a ball or poppet) that is spring-loaded or biased by a spring to a closed position. When pressure level upstream of the valve 330 reaches a preset pressure level that overcomes the force that the spring applies to the check element, the valve 330 opens and fluid is allowed to flow to the fluid reservoir 302. This way, fluid provided through the cooling fluid line 328 has the preset pressure level set by the spring. The valve 330 can be a combination of the example configurations mentioned above or any other valve configuration that allows pressure level to build up at the junction 326.

In another example, the valve 330 can be a proportional electronically-actuated valve. In this example, the controller (e.g., the controller board 200) can send a signal to an actuator (e.g., a solenoid) of the valve 330 to vary the pressure level upstream of the valve 330 based on cooling requirements (e.g., to provide sufficient cooling in a particular condition). A signal lines is not shown to the valve 330 to reduce visual clutter in the drawing.

The cooling fluid provided via the cooling fluid line 328 to the assembly 100 then circulates through the main housing 108 (see FIGS. 7A-10) and through the electronics housing cover 170 (see FIGS. 6A-6B), and is then provided through the fluid line 526 to cooling fluid return line 332, which provides the cooling fluid back to the fluid reservoir 302.

In an example, the electronic drive device 106 of the assembly 100 can receive sensor information indicative of the temperatures of the electric motor 102 and the inverter board 202. In response, the electronic drive device 106 controls the solenoid 514 of the flow control valve 510 to apportion cooling fluid between the electric motor 102 (e.g., to the cooling inner ring 700, 800, 900, 1000) and the electronics housing cover 170 such that the respective temperatures of the electric motor 102 and the inverter board 202 remain below safe operating temperatures.

The hydraulic system 300 can be referred to as an open-circuit or open loop system where the assembly 100 draws fluid from the fluid reservoir 302 and then provides fluid to the actuator 306 via the valve assembly 304, and fluid discharged from the actuator 306 returns to the fluid reservoir 302 via the valve assembly 304. Alternatively, the assembly 100 can be used in a closed-circuit configuration where fluid is circulated in a loop between the hydraulic pump 104 and the actuator 306.

Figure 12:
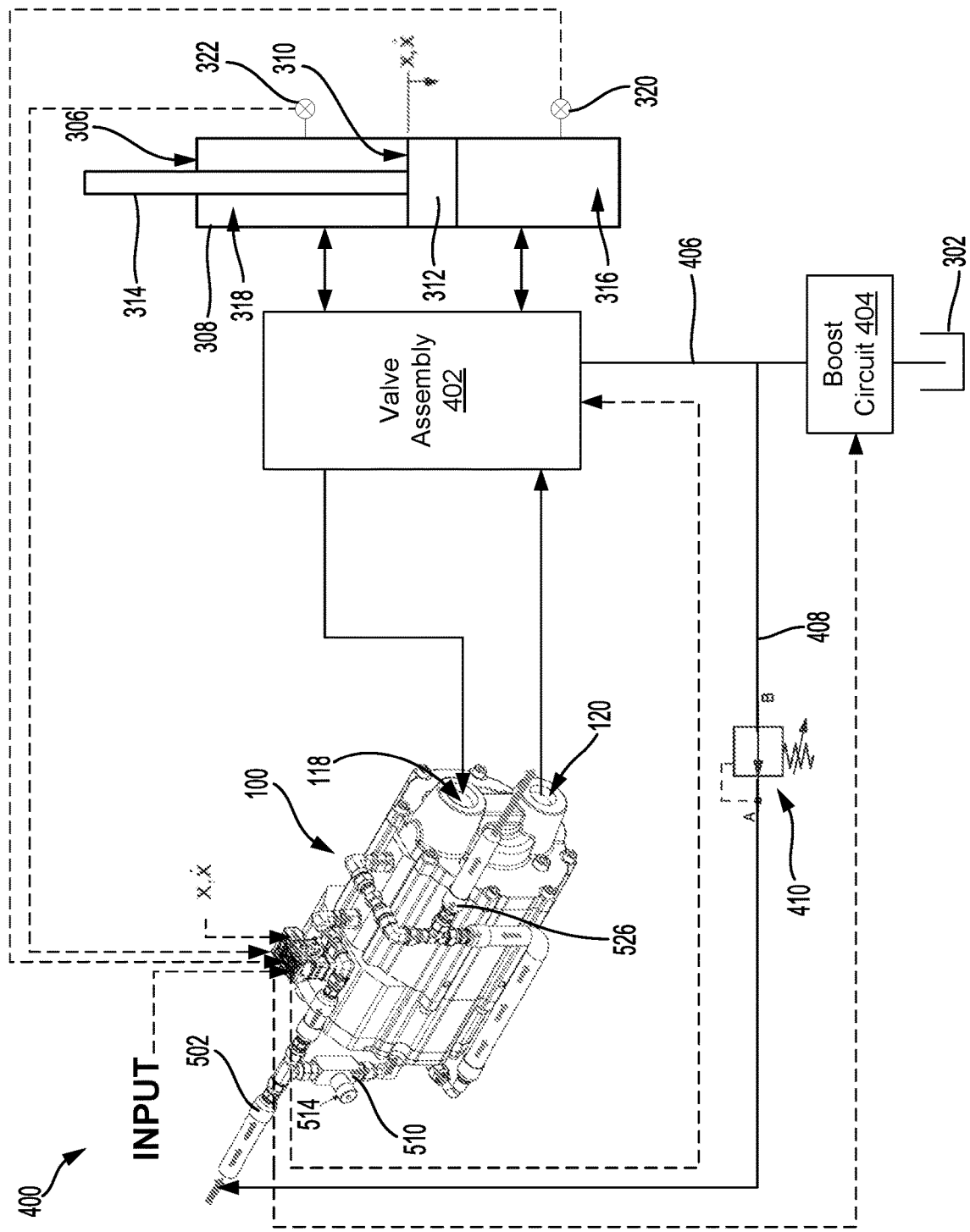
FIG. 12 illustrates a hydraulic system having the assembly of FIG. 1 operating in a closed-circuit configuration, in accordance with an example implementation.

FIG. 12 illustrates a hydraulic system 400 having the assembly 100 operating in a closed-circuit configuration, in accordance with an example implementation. Components of the hydraulic system 400 that are similar to components of the hydraulic system 300 are designated with the same reference numbers.

In the hydraulic system 400, the hydraulic pump 104 of the assembly 100 provides fluid from the outlet port 120 through a valve assembly 402 to the first chamber 316 or the second chamber 318, and fluid being discharged from the other chamber of the actuator 306 returns to the inlet port 118 of the assembly 100. As such, fluid circulates between the hydraulic pump 104 of the assembly 100 and the actuator 306.

Due to the configuration of the piston 310 with the rod 314 extending through the second chamber 318, fluid flow rate of fluid entering into or being discharged from the first chamber 316 is larger than a respective fluid flow rate of fluid entering into or being discharged from the second chamber 318. The hydraulic system 400 includes a boost circuit 404 configured to boost the fluid flow rate, or consume any excess flow, due to a difference in fluid flow rate of fluid provided to or discharged from the first chamber 316 and fluid flow rate of fluid provided to or discharged from the second chamber 318.

The boost circuit 404 can include, for example, a charge pump that is configured to draw fluid from the fluid reservoir 302 and provide boost fluid flow to a boost flow line 406, which is fluidly-coupled to the valve assembly 402. The valve assembly 402 can include a valve that facilitates joining make-up fluid flow from the boost flow line 406 with fluid discharged from the second chamber 318 before providing the fluid to the inlet port 118 of the assembly 100 to increase the fluid flow rate into the inlet port 118 when the piston 310 is extending.

In another example, the boost circuit 404 can comprise an accumulator configured to store pressurized fluid, and the fluid reservoir 302 might not be used. In another example, the hydraulic system includes multiple actuators and multiple assemblies similar to the assembly 100, and the boost circuit 404 can receive excess flow from other actuators to provide it as boost flow to the actuator 306.

The boost circuit 404 can also be configured to receive excess fluid flowing through the boost flow line 406 and provide a path for such excess fluid to the fluid reservoir 302 (or to other actuators in the system). Particularly, when the piston 310 is retracting and fluid discharged from the first chamber 316 is in excess of fluid consumed required by the second chamber 318, the excess flow is provided through the valve assembly 402 to the boost flow line 406, then to the boost circuit 404, which directs the fluid flow to the fluid reservoir 302 (or to other actuators in the system).

Additionally, in the hydraulic system 400, the boost circuit 404 can further be configured as the external source 500 providing cooling fluid to the assembly 100. Particularly, the boost circuit 404 can provide cooling fluid through a cooling fluid line 408, which is fluidly-coupled to the assembly 100 (e.g., to the fluid line 502).

In an example, the boost circuit 404 can be configured to provide pressurized fluid to the valve assembly 402 at a pressure level that is higher than the desired pressure level for the cooling fluid. For example, the boost circuit 404 may provide boost fluid flow at a pressure level of 400 psi, whereas the desired pressure level for the cooling fluid can be about 50 psi. In this case, the hydraulic system 400 can include a pressure reducing valve 410 configured to reduce the pressure level from 400 psi to 50 psi, and provide cooling fluid at a reduced pressure level downstream to the fluid line 502 providing cooling fluid to the assembly 100.

The pressure reducing valve 410 is represented symbolically in FIG. 12 and is not meant to be a limiting representation. A pilot operated pressure reducing valve could be used. Any valve or combination of components configured to reduce pressure level of fluid flowing therethrough can be used.

The cooling fluid exiting the pressure reducing valve 410 flows to the fluid line 502 then circulates through the main housing 108 (see FIGS. 7A-10) and through the electronics housing cover 170 (see FIGS. 6A-6B). The cooling fluid is then provided through the fluid line 526 to a cooling fluid return line, which provides the cooling fluid back to the fluid reservoir 302. The cooling fluid return line is not shown in FIG. 12 to reduce visual clutter in the drawing. However, it should be understood that the cooling fluid discharged through the fluid line 526 can be provided directly to the fluid reservoir 302, or indirectly through the valve assembly 402 and the boost circuit 404.

As mentioned above with respect to FIG. 11, in examples, the electronic drive device 106 of the assembly 100 can receive sensor information indicative of the temperatures of the electric motor 102 and the inverter board 202, and can responsively control the solenoid 514 of the flow control valve 510 to apportion cooling fluid between the electric motor 102 (e.g., to the cooling inner ring 700, 800, 900, 1000) and the electronics housing cover 170 such that the respective temperatures of the electric motor 102 and the inverter board 202 remain below safe operating temperatures.

Several configuration variations can be implemented to the example implementation depicted in FIGS. 1-10. For example, rather than having the main housing 108 coupled to the electronic device housing 140, which is configured as a separate housing, both housings can be combined into a single housing. As another example, other types of pumps can be used. Also, in another example implementation, a gearbox might be used to couple the motor rotor 114 to the pump drive shaft 134. Also, while the hydraulic pump 104 is disposed partially within the stator 112, in another example implementation, the pump can be disposed completely within the windings of the stator.

The detailed description above describes various features and operations of the disclosed systems with reference to the accompanying figures. The illustrative implementations described herein are not meant to be limiting. Certain aspects of the disclosed systems can be arranged and combined in a wide variety of different configurations, all of which are contemplated herein.

Further, unless context suggests otherwise, the features illustrated in each of the figures may be used in combination with one another. Thus, the figures should be generally viewed as component aspects of one or more overall implementations, with the understanding that not all illustrated features are necessary for each implementation.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Further, devices or systems may be used or configured to perform functions presented in the figures. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide The arrangements described herein are for purposes of example only. As such, those skilled in the art will appreciate that other arrangements and other elements (e.g., machines, interfaces, operations, orders, and groupings of operations, etc.) can be used instead, and some elements may be omitted altogether according to the desired results. Further, many of the elements that are described are functional entities that may be implemented as discrete or distributed components or in conjunction with other components, in any suitable combination and location.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. Also, the terminology used herein is for the purpose of describing particular implementations only, and is not intended to be limiting.

Embodiments of the present disclosure can thus relate to one of the enumerated example embodiments (EEEs) listed below.

EEE 1 is an assembly comprising: a main housing having an internal chamber therein; an electric motor disposed in the internal chamber of the main housing and comprising a motor rotor; a cooling inner ring disposed in the internal chamber of the main housing about the electric motor, wherein the cooling inner ring comprises one or more motor cooling fluid channels configured to receive cooling fluid from an external source of cooling fluid and allow cooling fluid to flow about the electric motor to cool the electric motor: a hydraulic pump positioned in the main housing, at least partially within the motor rotor of the electric motor; and an enclosure coupled to the main housing and comprising (i) an inverter board disposed therein, and (ii) one or more inverter cooling fluid channels configured to allow cooling fluid from the external source to cool the inverter board.

EEE 2 is the assembly of EEE 1, wherein the cooling inner ring comprises a plurality of arcuate ridges such that the one or more motor cooling fluid channels are formed therebetween.

EEE 3 is the assembly of any of EEEs 1-2, wherein the cooling inner ring comprises a spiral or zigzagging motor cooling fluid channel that is formed as a depression about an exterior surface of the cooling inner ring.

EEE 4 is the assembly of any of EEEs 1-3, wherein the cooling inner ring comprises a plurality of protrusions, wherein respective protrusions of the plurality of protrusions have a polygonal shape, such that the one or more motor cooling fluid channels are formed between the plurality of protrusions, thereby allowing cooling fluid to be diffused therethrough.

EEE 5 is the assembly of any of EEEs 1-4, wherein the main housing comprises: a motor cooling fluid inlet port configured to receive cooling fluid from the external source and provide cooling fluid to the one or more motor cooling fluid channels of the cooling inner ring; and a motor cooling fluid outlet port configured to provide cooling fluid that has flowed through the one or more motor cooling fluid channels to a fluid reservoir.

EEE 6 is the assembly of any of EEEs 1-5, wherein the enclosure comprises: an electronic device housing coupled to the main housing; and an electronics housing cover coupled to the electronic device housing, such that the enclosure is formed by the electronics housing cover and the electronic device housing.

EEE 7 is the assembly of EEE 6, wherein the inverter board is mounted to the electronics housing cover, and wherein the one or more inverter cooling fluid channels are formed in the electronics housing cover.

EEE 8 is the assembly of EEE 7, further comprising: a back plate coupled to the electronics housing cover, wherein the back plate comprises: (i) an inverter cooling fluid inlet port configured to receive cooling fluid from the external source and provide cooling fluid to the one or more inverter cooling fluid channels formed in the electronics housing cover, and (ii) an inverter cooling fluid outlet port configured to receive cooling fluid that has flowed through the one or more inverter cooling fluid channels and provide cooling fluid to a fluid reservoir.

EEE 9 is the assembly of EEE 8, wherein a portion of an inverter cooling fluid channel of the one or more inverter cooling fluid channels is formed in the electronics housing cover and another mating portion of the inverter cooling fluid channel is formed in the back plate.

EEE 10 is the assembly of any of EEEs 1-9, further comprising: a flow control valve configured to apportion cooling fluid between the cooling inner ring and the enclosure.

EEE 11 is a hydraulic system comprising: an actuator having a first chamber and a second chamber: a valve assembly configured to control fluid flow to and from the first chamber and the second chamber of the actuator; and an assembly comprising: a main housing having an internal chamber therein, an electric motor disposed in the internal chamber of the main housing and comprising a motor rotor, a cooling inner ring disposed in the internal chamber of the main housing about the electric motor, wherein the cooling inner ring comprises one or more motor cooling fluid channels configured to receive cooling fluid from an external source of cooling fluid and allow cooling fluid to flow about the electric motor to cool the electric motor, wherein the main housing comprises: (i) a motor cooling fluid inlet port configured to receive cooling fluid and provide cooling fluid to the one or more motor cooling fluid channels, and (ii) a motor cooling fluid outlet port configured to discharge cooling fluid that has flowed through the one or more motor cooling fluid channels, a hydraulic pump positioned in the main housing, at least partially within the motor rotor of the electric motor, wherein the hydraulic pump is configured to receive fluid from an inlet port and provide fluid flow to an outlet port that is fluidly-coupled to the valve assembly, such that the hydraulic pump is configured to provide fluid flow to the actuator via the valve assembly, and an enclosure coupled to the main housing and comprising (i) an inverter board disposed therein, and (ii) one or more inverter cooling fluid channels configured to allow cooling fluid from the external source to cool the inverter board, (iii) an inverter cooling fluid inlet port configured to receive cooling fluid and provide cooling fluid to the one or more inverter cooling fluid channels, and (iv) an inverter cooling fluid outlet port configured to discharge cooling fluid that has flowed through the one or more inverter cooling fluid channels.

EEE 12 is the hydraulic system of EEE 11, further comprising: a fluid reservoir, wherein the inlet port of the hydraulic pump is fluidly-coupled to the fluid reservoir such that the hydraulic pump draws fluid from the fluid reservoir, and wherein the valve assembly is fluidly-coupled to the fluid reservoir to provide fluid discharged from the actuator to the fluid reservoir, wherein a portion of fluid discharged from the actuator branches out to be provided to the motor cooling fluid inlet port and the inverter cooling fluid inlet port, such that the actuator is the external source of cooling fluid.

EEE 13 is the hydraulic system of EEE 12, further comprising: a valve disposed in a fluid line that fluidly couples the actuator and the fluid reservoir, wherein the valve is configured to increase pressure level upstream of the valve, and wherein the portion of fluid provided to the motor cooling fluid inlet port and the inverter cooling fluid inlet port is branched out at a junction disposed upstream of the valve.

EEE 14 is the hydraulic system of any of EEEs 11-13, wherein the assembly is configured to (i) receive fluid discharged from the actuator through the valve assembly at the inlet port, and (ii) provide fluid via the outlet port through the valve assembly to the actuator, wherein the hydraulic system further comprises: a boost circuit that is fluidly-coupled to the valve assembly, wherein the boost circuit is configured to provide boost fluid flow and receive excess fluid flow due to a difference in fluid flow rate of fluid provided to or discharged from the first chamber and fluid flow rate of fluid provided to or discharged from the second chamber, and wherein the boost circuit is fluidly-coupled to the motor cooling fluid inlet port and the inverter cooling fluid inlet port to provide cooling fluid thereto, such that the boost circuit is the external source of cooling fluid.

EEE 15 is the hydraulic system of EEE 14, further comprising: a pressure reducing valve configured to receive cooling fluid from the boost circuit and provide cooling fluid at a reduced pressure level to the motor cooling fluid inlet port and the inverter cooling fluid inlet port.

EEE 16 is the hydraulic system of any of EEEs 11-15, wherein the enclosure comprises: an electronic device housing coupled to the main housing; and an electronics housing cover coupled to the electronic device housing, such that the enclosure is formed by the electronics housing cover and the electronic device housing.

EEE 17 is the hydraulic system of EEE 16, wherein the inverter board is mounted to the electronics housing cover, and wherein the one or more inverter cooling fluid channels are formed in the electronics housing cover.

EEE 18 is the hydraulic system of EEE 17, wherein the assembly further comprises: a back plate coupled to the electronics housing cover, wherein the back plate comprises the inverter cooling fluid inlet port and the inverter cooling fluid outlet port, and wherein a portion of an inverter cooling fluid channel of the one or more inverter cooling fluid channels is formed in the electronics housing cover and another mating portion of the inverter cooling fluid channel is formed in the back plate.

EEE 19 is the hydraulic system of any of EEEs 11-18, further comprising: a flow control valve configured to apportion cooling fluid between the cooling inner ring and the enclosure.

EEE 20 is the hydraulic system of any of EEE 11-19, wherein the cooling inner ring comprises: a plurality of arcuate ridges such that the one or more motor cooling fluid channels are formed therebetween, a spiral motor cooling fluid channel that is formed as a looping depression about an exterior surface of the cooling inner ring, a zigzagging motor cooling fluid channel that is formed as a depression about an exterior surface of the cooling inner ring, or a plurality of protrusions, wherein respective protrusions of the plurality of protrusions have a polygonal shape, such that the one or more motor cooling fluid channels are formed between the plurality of protrusions, thereby allowing cooling fluid to be diffused therethrough.

What is claimed is:

1. An assembly comprising:
a main housing having an internal chamber therein;
an electric motor disposed in the internal chamber of the main housing and comprising a motor rotor;
a cooling inner ring disposed in the internal chamber of the main housing about the electric motor, wherein the cooling inner ring comprises one or more motor cooling fluid channels configured to receive cooling fluid from an external source of cooling fluid and allow cooling fluid to flow about the electric motor to cool the electric motor;
a hydraulic pump positioned in the main housing, at least partially within the motor rotor of the electric motor such that the hydraulic pump is driven by the motor rotor; and
an enclosure coupled to the main housing and comprising (i) an inverter board disposed therein, and (ii) one or more inverter cooling fluid channels configured to allow cooling fluid from the external source to cool the inverter board.

2. The assembly of claim 1, wherein the cooling inner ring comprises a plurality of arcuate ridges such that the one or more motor cooling fluid channels are formed therebetween.

3. The assembly of claim 1, wherein the cooling inner ring comprises a spiral or zigzagging motor cooling fluid channel that is formed as a depression about an exterior surface of the cooling inner ring.

4. The assembly of claim 1, wherein the cooling inner ring comprises a plurality of protrusions, wherein respective protrusions of the plurality of protrusions have a polygonal shape, such that the one or more motor cooling fluid channels are formed between the plurality of protrusions, thereby allowing cooling fluid to be diffused therethrough.

5. The assembly of claim 1, wherein the main housing comprises:
a motor cooling fluid inlet port configured to receive cooling fluid from the external source and provide cooling fluid to the one or more motor cooling fluid channels of the cooling inner ring; and
a motor cooling fluid outlet port configured to provide cooling fluid that has flowed through the one or more motor cooling fluid channels to a fluid reservoir.

6. The assembly of claim 1, wherein the enclosure comprises:
an electronic device housing coupled to the main housing; and
an electronics housing cover coupled to the electronic device housing, such that the enclosure is formed by the electronics housing cover and the electronic device housing.

7. The assembly of claim 6, wherein the inverter board is mounted to the electronics housing cover, and wherein the one or more inverter cooling fluid channels are formed in the electronics housing cover.

8. The assembly of claim 7, further comprising:
a back plate coupled to the electronics housing cover, wherein the back plate comprises: (i) an inverter cooling fluid inlet port configured to receive cooling fluid from the external source and provide cooling fluid to the one or more inverter cooling fluid channels formed in the electronics housing cover, and (ii) an inverter cooling fluid outlet port configured to receive cooling fluid that has flowed through the one or more inverter cooling fluid channels and provide cooling fluid to a fluid reservoir.

9. The assembly of claim 8, wherein a portion of an inverter cooling fluid channel of the one or more inverter cooling fluid channels is formed in the electronics housing cover and another mating portion of the inverter cooling fluid channel is formed in the back plate.

10. The assembly of claim 1, further comprising:
a flow control valve configured to apportion cooling fluid between the cooling inner ring and the enclosure.

11. A hydraulic system comprising:
an actuator having a first chamber and a second chamber;
a valve assembly configured to control fluid flow to and from the first chamber and the second chamber of the actuator; and
an assembly comprising:
a main housing having an internal chamber therein,
an electric motor disposed in the internal chamber of the main housing and comprising a motor rotor,
a cooling inner ring disposed in the internal chamber of the main housing about the electric motor, wherein the cooling inner ring comprises one or more motor cooling fluid channels configured to receive cooling fluid from an external source of cooling fluid and allow cooling fluid to flow about the electric motor to cool the electric motor, wherein the main housing comprises: (i) a motor cooling fluid inlet port configured to receive cooling fluid and provide cooling fluid to the one or more motor cooling fluid channels, and (ii) a motor cooling fluid outlet port configured to discharge cooling fluid that has flowed through the one or more motor cooling fluid channels,
a hydraulic pump positioned in the main housing, at least partially within the motor rotor of the electric motor, wherein the hydraulic pump is configured to receive fluid from an inlet port and provide fluid flow to an outlet port that is fluidly-coupled to the valve assembly, such that the hydraulic pump is configured to provide fluid flow to the actuator via the valve assembly, and
an enclosure coupled to the main housing and comprising (i) an inverter board disposed therein, and (ii) one or more inverter cooling fluid channels configured to allow cooling fluid from the external source to cool the inverter board, (iii) an inverter cooling fluid inlet port configured to receive cooling fluid and provide cooling fluid to the one or more inverter cooling fluid channels, and (iv) an inverter cooling fluid outlet port configured to discharge cooling fluid that has flowed through the one or more inverter cooling fluid channels.

12. The hydraulic system of claim 11, further comprising:
a fluid reservoir, wherein the inlet port of the hydraulic pump is fluidly-coupled to the fluid reservoir such that the hydraulic pump draws fluid from the fluid reservoir, and wherein the valve assembly is fluidly-coupled to the fluid reservoir to provide fluid discharged from the actuator to the fluid reservoir, wherein a portion of fluid discharged from the actuator branches out to be provided to the motor cooling fluid inlet port and the inverter cooling fluid inlet port, such that the actuator is the external source of cooling fluid.

13. The hydraulic system of claim 12, further comprising:
a valve disposed in a fluid line that fluidly couples the actuator and the fluid reservoir, wherein the valve is configured to increase pressure level upstream of the valve, and wherein the portion of fluid provided to the motor cooling fluid inlet port and the inverter cooling fluid inlet port is branched out at a junction disposed upstream of the valve.

14. The hydraulic system of claim 11, wherein the assembly is configured to (i) receive fluid discharged from the actuator through the valve assembly at the inlet port, and (ii) provide fluid via the outlet port through the valve assembly to the actuator, wherein the hydraulic system further comprises:
a boost circuit that is fluidly-coupled to the valve assembly, wherein the boost circuit is configured to provide boost fluid flow and receive excess fluid flow due to a difference in fluid flow rate of fluid provided to or discharged from the first chamber and fluid flow rate of fluid provided to or discharged from the second chamber, and wherein the boost circuit is fluidly-coupled to the motor cooling fluid inlet port and the inverter cooling fluid inlet port to provide cooling fluid thereto, such that the boost circuit is the external source of cooling fluid.

15. The hydraulic system of claim 14, further comprising:
a pressure reducing valve configured to receive cooling fluid from the boost circuit and provide cooling fluid at a reduced pressure level to the motor cooling fluid inlet port and the inverter cooling fluid inlet port.

16. The hydraulic system of claim 11, wherein the enclosure comprises:
an electronic device housing coupled to the main housing; and
an electronics housing cover coupled to the electronic device housing, such that the enclosure is formed by the electronics housing cover and the electronic device housing.

17. The hydraulic system of claim 16, wherein the inverter board is mounted to the electronics housing cover, and wherein the one or more inverter cooling fluid channels are formed in the electronics housing cover.

18. The hydraulic system of claim 17, wherein the assembly further comprises:

a back plate coupled to the electronics housing cover, wherein the back plate comprises the inverter cooling fluid inlet port and the inverter cooling fluid outlet port, and wherein a portion of an inverter cooling fluid channel of the one or more inverter cooling fluid channels is formed in the electronics housing cover and another mating portion of the inverter cooling fluid channel is formed in the back plate.

19. The hydraulic system of claim 11, further comprising:
a flow control valve configured to apportion cooling fluid between the cooling inner ring and the enclosure.

20. The hydraulic system of claim 11, wherein the cooling inner ring comprises:
a plurality of arcuate ridges such that the one or more motor cooling fluid channels are formed therebetween,
a spiral motor cooling fluid channel that is formed as a looping depression about an exterior surface of the cooling inner ring,
a zigzagging motor cooling fluid channel that is formed as a depression about an exterior surface of the cooling inner ring, or
a plurality of protrusions, wherein respective protrusions of the plurality of protrusions have a polygonal shape, such that the one or more motor cooling fluid channels are formed between the plurality of protrusions, thereby allowing cooling fluid to be diffused therethrough.

* * * * *